(12) United States Patent
Wischnewskly et al.

(10) Patent No.: US 8,344,592 B2
(45) Date of Patent: Jan. 1, 2013

(54) ULTRASONIC MOTOR

(75) Inventors: Wladimir Wischnewskly, Waldbronn (DE); Alexej Wischnewsklj, Wörth (DE)

(73) Assignee: Physik Instruments (PI) GmbH & Co. KG, Karlsruhe (DE)

( * ) Notice: Subject to any disclaimer, the term of this patent is extended or adjusted under 35 U.S.C. 154(b) by 95 days.

(21) Appl. No.: 12/736,022

(22) PCT Filed: Mar. 5, 2009

(86) PCT No.: PCT/EP2009/052565
§ 371 (c)(1),
(2), (4) Date: Nov. 8, 2010

(87) PCT Pub. No.: WO2009/109606
PCT Pub. Date: Sep. 11, 2009

(65) Prior Publication Data
US 2011/0050035 A1      Mar. 3, 2011

(30) Foreign Application Priority Data

Mar. 7, 2008 (DE) .......................... 10 2008 012 992

(51) Int. Cl.
H01L 41/08 (2006.01)
(52) U.S. Cl. .................................. 310/323.02
(58) Field of Classification Search .............. 310/323.02
See application file for complete search history.

(56) References Cited

U.S. PATENT DOCUMENTS

| | | | | |
|---|---|---|---|---|
| 4,453,103 A * | 6/1984 | Vishnevsky et al. | ..... | 310/323.02 |
| 6,081,063 A | 6/2000 | Kasuga et al. | ........... | 310/323.02 |
| 6,218,769 B1 * | 4/2001 | Iino et al. | ..................... | 310/328 |
| 6,465,931 B2 * | 10/2002 | Knowles et al. | ......... | 310/316.01 |
| 6,586,860 B1 * | 7/2003 | Iino et al. | .................. | 310/316.02 |
| 6,765,335 B2 * | 7/2004 | Wischnewskiy | ......... | 310/323.02 |
| 6,806,620 B1 * | 10/2004 | Wischnewskiy | ......... | 310/323.02 |
| 7,119,475 B2 * | 10/2006 | Matsuzaki et al. | ........ | 310/316.01 |
| 7,205,703 B2 | 4/2007 | Funakubo et al. | ........ | 310/323.02 |
| 7,211,929 B2 | 5/2007 | Ganor et al. | ................... | 310/317 |
| 7,598,656 B2 * | 10/2009 | Wischnewskij et al. | . | 310/323.01 |
| 7,893,642 B2 * | 2/2011 | Suzuki | ........................ | 318/560 |
| 2004/0189155 A1 | 9/2004 | Funakubo | ..................... | 310/366 |
| 2005/0062367 A1 | 3/2005 | Funakubo et al. | ............ | 310/366 |
| 2007/0108869 A1 | 5/2007 | Koc et al. | ................... | 310/316.1 |
| 2010/0013353 A1 | 1/2010 | Wischnewskij et al. | ...... | 310/317 |

FOREIGN PATENT DOCUMENTS

| | | |
|---|---|---|
| DE | 19938954 | 3/2001 |
| DE | 102005039358 | 3/2007 |
| EP | 1267425 | 12/2002 |
| WO | WO 2005/114760 | * 12/2005 |

OTHER PUBLICATIONS

International Search Report (in English) dated Jul. 13, 2009 and English version of the International Preliminary Report on Patentability dated Oct. 5, 2010.

* cited by examiner

*Primary Examiner* — Mark Budd
(74) *Attorney, Agent, or Firm* — Gerald T. Bodner

(57) ABSTRACT

The invention relates to an ultrasonic motor having a multilayer actuator in the form of a multilayer plate, having one or more friction elements or friction layers on its side surfaces and having an electrical exciter apparatus for the actuator. According to the invention, the multilayer plate has two intersecting, mirror-imaged asymmetrical generators for ultrasonic vibrations, to be precise in the form of layers of exciter electrodes and general electrodes which are alternately arranged with layers of piezoelectric ceramic, wherein a two-dimensional asymmetrical acoustic standing wave is generated in the multilayer actuator.

26 Claims, 38 Drawing Sheets

ULTRASONIC MOTOR

Figure 1:
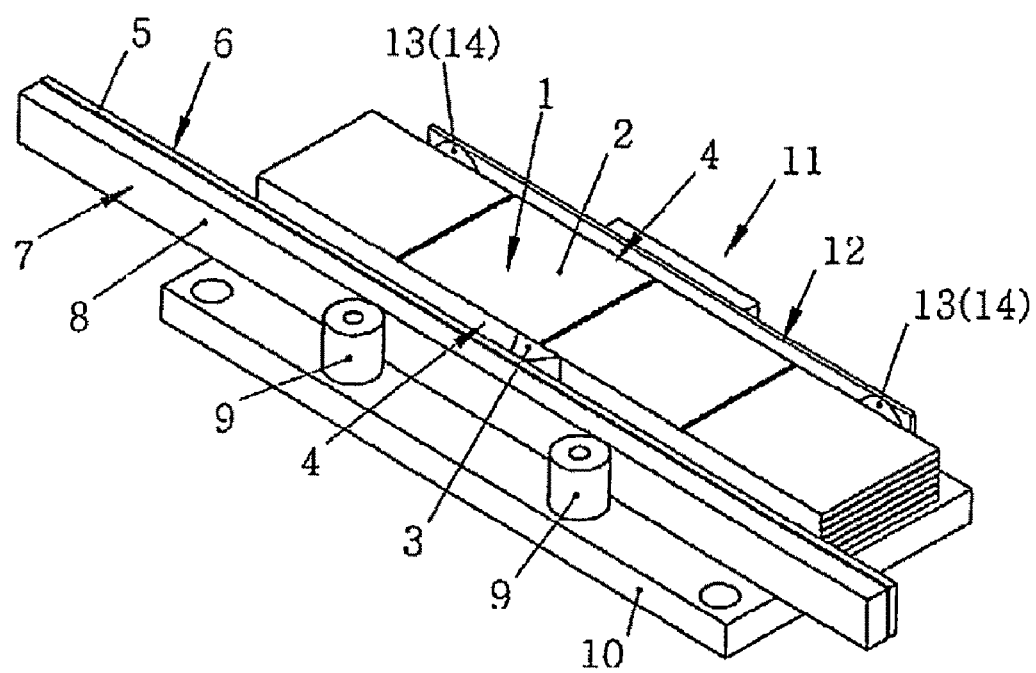

The invention belongs to the group of ultrasonic drive apparatus comprising a multilayer actuator, which can be used in miniaturized electromechanical systems and contain high-precision moving parts, such as lenses or optical lens groups, objectives, magnetic or optical heads of storage devices or miniaturized positioning tables and the like.

Ultrasonic motors comprising ultrasonic multilayer actuators are, for instance, known from the patent documents U.S. Pat. No. 6,081,063; U.S. Pat. No. 7,205,703 B2; U.S. Pat. No. 7,211,929 B2; US 2007/0108869 A1. In any of these motors the actuator is constructed as a plate, which is tuned to the first longitudinal and the second bending mode of the oscillations. This means that during the operation of the motor the first longitudinal and the second bending mode of the oscillations in the plate are excited simultaneously. The actuator is here excited by an electrical voltage of the same frequency. In order to obtain an optimum path of motion of the friction element the frequencies of the longitudinal and bending resonance slightly differ from each other. Therefore, the frequency phase characteristics of these actuators have two zeros which are close to each other, with the excitation frequency of the actuator being generally close to these zeros, that is, in an indefinite range of the frequency phase characteristics.

By altering the temperature, or by the influence of strongly acting forces, the resonance frequencies of the plate are slightly shifted so that the excitation frequency of the actuator likewise has to be modified. In order to be able to keep the excitation frequency constant the excitation device is constructed to be able to follow the phase signal. The indefinite frequency phase characteristic results in an unstable behavior of the excitation device, however, so that a spontaneous, periodic switching from one frequency to another frequency can occur. This deteriorates the functional stability of the motors, leads to the occurrence of acoustic noises and to an increase of the abrasion of the friction contact.

The use of the bending oscillation mode additionally leads to a deterioration of the efficiency of the actuator so that it is impossible to have a mobile element which is sufficiently rigid act on such an actuator.

Moreover, an ultrasonic motor comprising a multilayer actuator is known, which is not prone to the aforementioned disadvantages (see DE 10 2005 039 358 A1).

The functional principle of this motor is based on the excitation of an asymmetrical two-dimensional standing wave in the actuator plate. Such a wave only has one actuator resonance position. The excitation of this wave is accomplished by one of the two multilayer generators. The generators are disposed on both sides of the sectional plane extending through the center of the plate length of the actuator. The excited wave has a great oscillation maximum located in the central part of the actuator plate. Only this maximum does allow the motion of the driven element.

The optimum waveform is obtained only with a definite ratio of plate length to plate height of the actuator. This means that the ratio has to be approximately 2 to 3. If this ratio is increased or decreased, the waveform is changed which, again, leads to a great deterioration of the function of the motor, i.e. to a reduction of its mechanical performance and to an increased abrasion of the frictional contact. With a given length of the actuator it is therefore impossible to reduce the height of the motor. This means that such a motor cannot be realized as a flat motor. This constricts the fields of application of the motor for miniaturized electromechanical systems, in particular if the construction height of the drive is an important factor for the usability of the system.

In addition, with the motor according to patent document DE 10 2005 039 358 A1 a friction element can be disposed on one of the sides of the actuator. This renders the actuator mechanically unstable. If the load on the driven element is increased such an actuator changes its angular position. This results in a deterioration of the frictional contact which, again, leads to a reduction of the tensile force. Hence, the stability of the motor and the positioning accuracy of the driven elements are reduced.

It is the object of the invention to increase the mechanical performance, to reduce the construction height of the actuator, to improve the mechanical stability of the actuator, to improve the operating stability, to reduce the abrasion of the frictional contact, to increase the positioning accuracy, to reduce the generation of noise and to increase the operating stability in a broad temperature and load range.

The invention is based on the object to realize an ultrasonic motor such that it is possible in a simple way, as a result of its specific constructive solution and the use of a new acoustic ultrasonic wave, to obtain characteristics that represent a positive effect relative to the existing prior art.

The above-defined object is achieved by realizing the proposed high-precision ultrasonic motor in accordance with the features of patent claim 1.

In addition, the multilayer plate may be realized as a rectangle or as part of a ring or also in any other optional form, wherein the asymmetrical standing wave excited by one of the aforementioned generators is a mirror image of the wave generated by the second generator. This expands the constructive fields of application of the proposed invention.

Moreover, the height of the multilayer plate of the actuator can be equal to or slightly smaller than a quarter of its length. This enhances the power generated by the motor.

In the proposed motor the alternate layers of the electrodes and the layers of the piezoelectric ceramics of the multilayer actuator realized as a rectangular plate may be arranged parallel to its principal planes or parallel to its lateral faces or parallel to its end faces.

Thus, it is possible to vary the quantity of the excitation voltage. In one of the proposed motor modifications the alternate layers of the electrodes and the layers of the piezoelectric ceramics of the multilayer actuator realized as part of a ring can be arranged parallel to the principal planes of the multilayer plate.

This simplifies the production technology for the actuators.

In the proposed ultrasonic motor the layers of the electrodes and the piezoelectric ceramics of the multilayer plate of the actuator can be connected to each other during the production of the piezoelectric ceramics, so that a monolithic body is formed. This increases the stability of the multilayer actuator.

In various modifications of the proposed motor the surface of the multilayer plate of the actuator can be provided with a thin protective layer. This allows to protect the proposed motor against the action of aggressive media.

In some modifications of the proposed motor the multilayer plate of the actuator can comprise one or two friction elements, which are disposed on one or two of the lateral faces in the central part. This increases the movement speed of the driven element.

In other modifications of the motor the multilayer plate of the actuator can comprise two or four friction elements which are disposed on one or two of the lateral faces at a distance from the end faces, which is approximately equal to a quarter of its length relative to the center line. This enhances the power generated by the motor.

In other modifications of the proposed motor the friction elements may be made of a hard, abrasion-proof material, such as oxide ceramics or another similar material. This reduces the abrasion of the frictional contact of the motor.

The friction elements in the proposed motor may be welded onto the surfaces of the multilayer plate with a low-melting glass. This increases the operational use temperature of the motor.

The friction elements may also be realized as stripes of abrasion-proof glass or glass enriched with an abrasion-proof material. This simplifies the production technology of the multilayer actuator.

In various modifications of the proposed motor the friction elements or the lateral faces of the multilayer plate of the actuator may comprise guide grooves having a round, V-shaped or any other form.

Moreover, the friction elements or the lateral faces of the multilayer plate of the actuator may comprise guide rails having a round, V-shaped or any other form. This simplifies the construction of the motor.

In these proposed motor modifications the guide grooves or guide rails may have abrasion-proof layers. This increases the lifetime of the motor.

In other modifications of the proposed motor the multilayer plate of the oscillator may comprise two or four holding members which are arranged on one of its lateral faces. This increases the functional stability of the motor and the positioning accuracy of the driven element.

In some modifications of the proposed motor the electric excitation device may be realized as a self-exciting generator whose excitation frequency is determined by the resonance frequency of the oscillator connected to it.

In other modifications of the proposed motor the excitation device can contain a voltage-controlled generator whose excitation frequency is predetermined by the phase detector whose phase input is electrically connected to the feedback element or to the electrode of the multilayer actuator.

Both the one and the other increase the operational reliability of the motor. In the modifications of the proposed motor the excitation device may comprise a half-bridge or a bridge power amplifier which is connected to the multilayer actuator by means of the LC series filter, with the capacitance of the capacitor being approximately equal to or slightly greater than the input capacitance of the multilayer actuator. This enhances the quality of the filter and reduces the energy losses in the power amplifier.

In some modifications of the proposed motor the excitation device is realized as self-exciting generator whose excitation frequency is determined by the resonance frequency of the oscillator connected to it and may include a symmetrical PWM modulator for the feedback voltage and a generator for modulated mesh voltage whose frequency is approximately 10 times greater than the operating frequency of the multilayer actuator.

In this case, the excitation device can be connected via the LC bandpass filter to the multilayer actuator, whose capacitor is formed by the electric capacitance of the multilayer actuator, wherein its resonance frequency is between the operating frequency of the actuator and the modulation frequency of the PWM modulator.

This reduces the energy losses in the electric excitation device. In the proposed motor the electric excitation device may consist of a linear power amplifier and a compensating coil connected in parallel with the multilayer actuator. This increases the operating stability of the motor.

Figure 16:
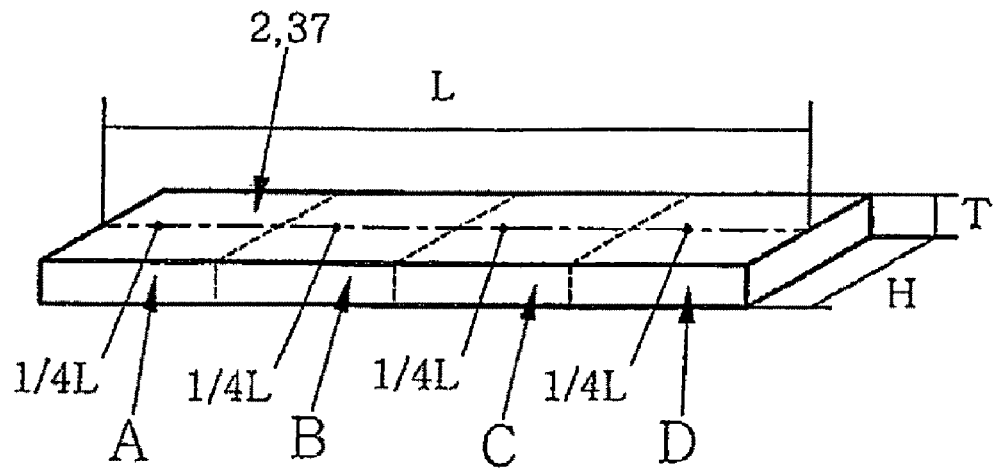
Figure 16:
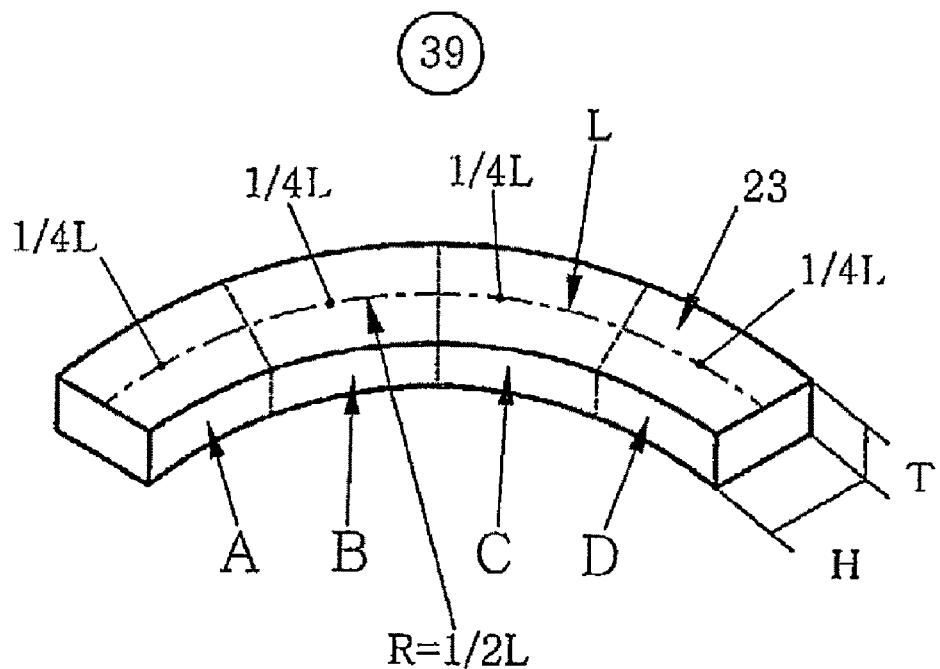
Figure 20:
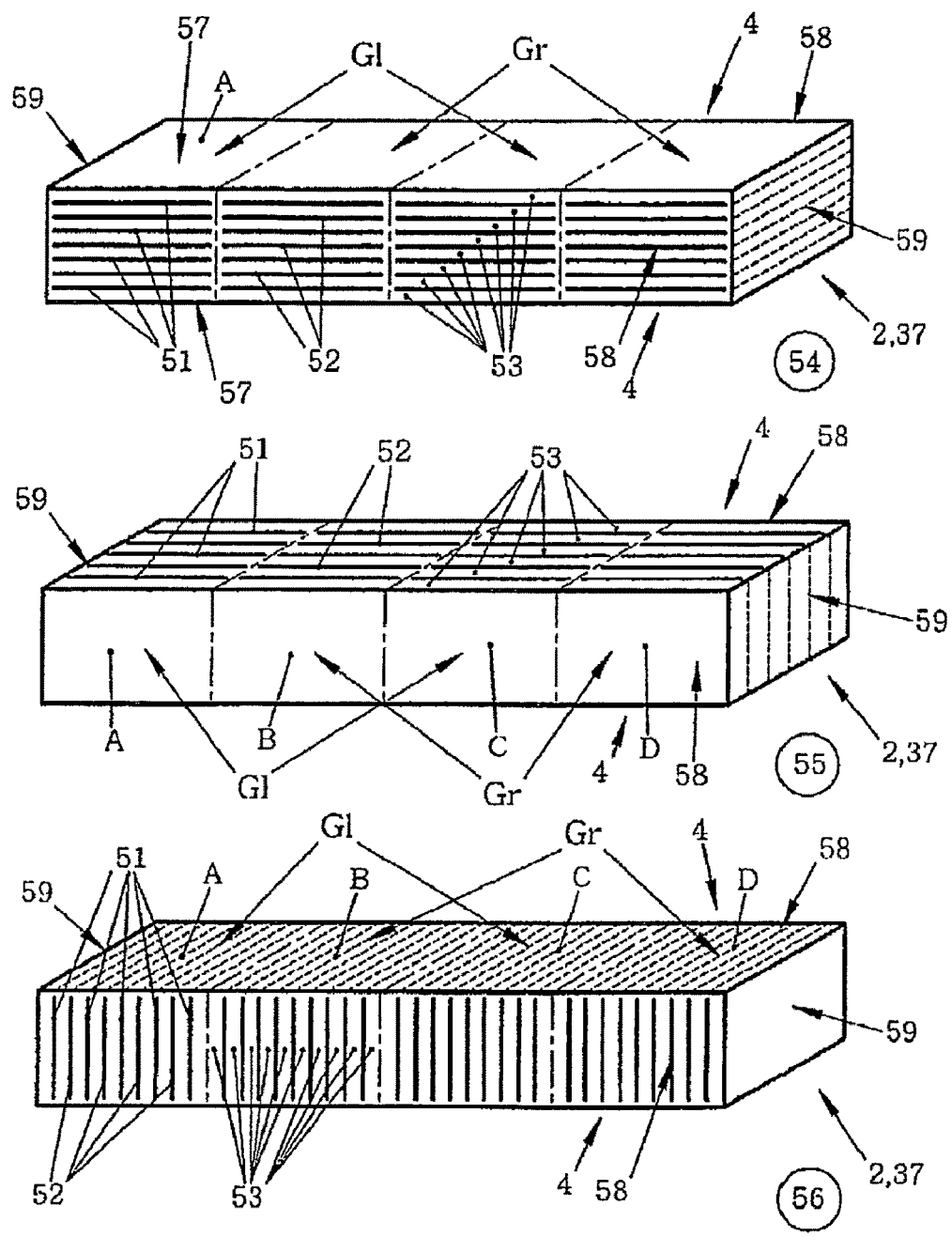
Figure 21:
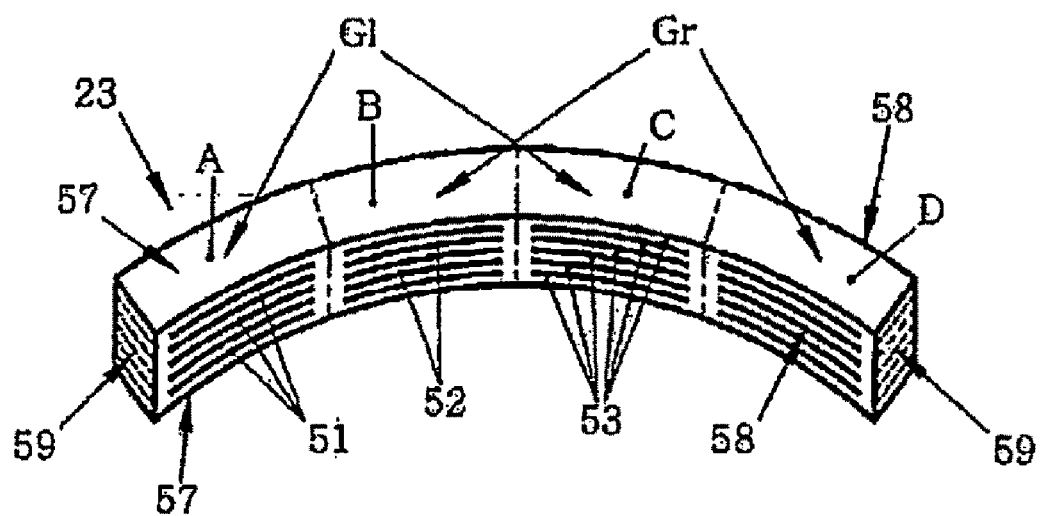
Figure 22:
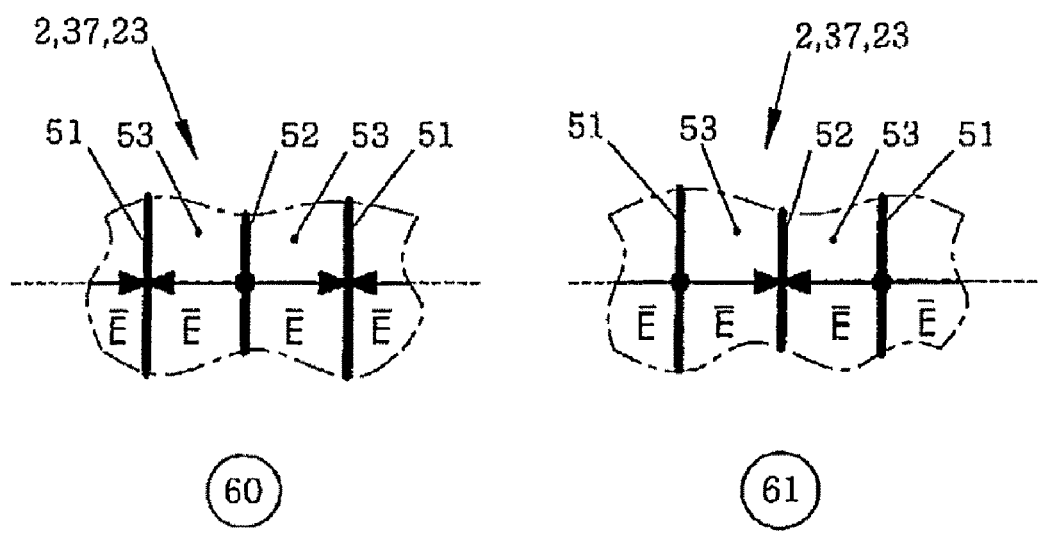
Figure 23:
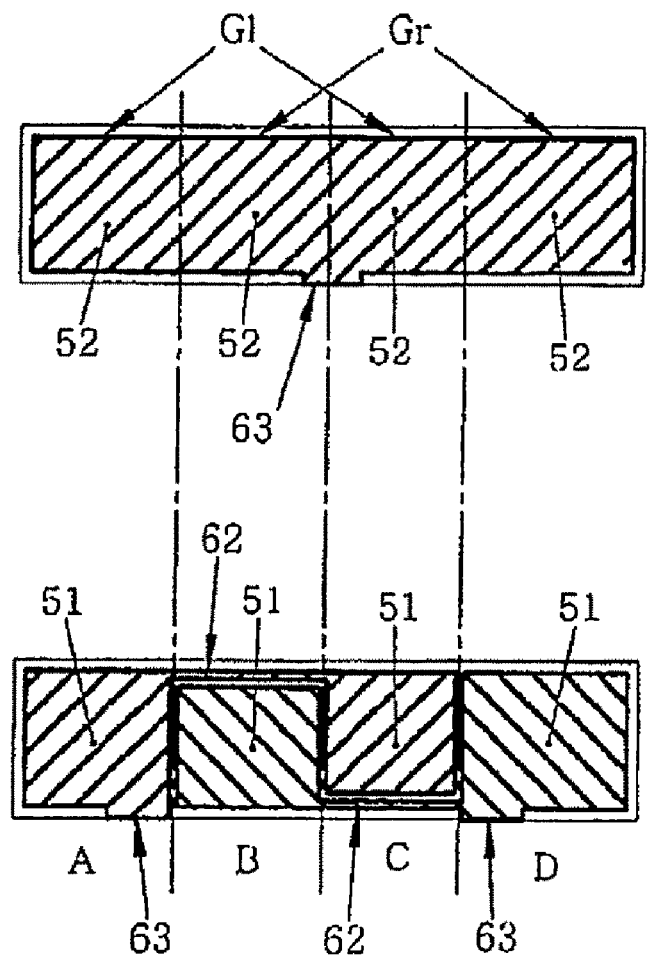
Figure 23:
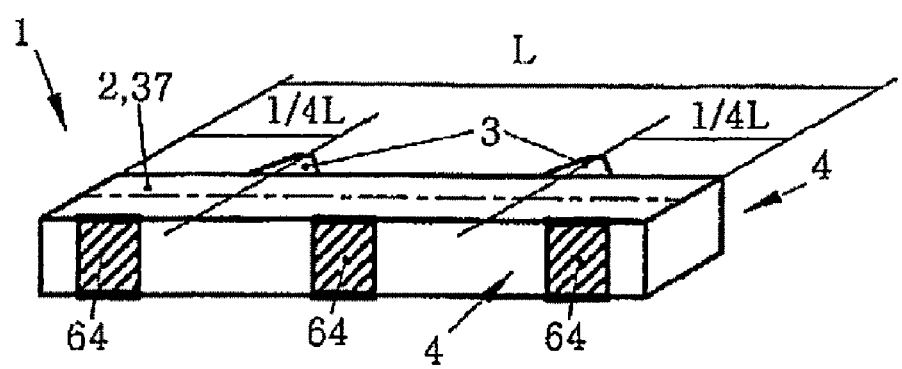
Figure 24:
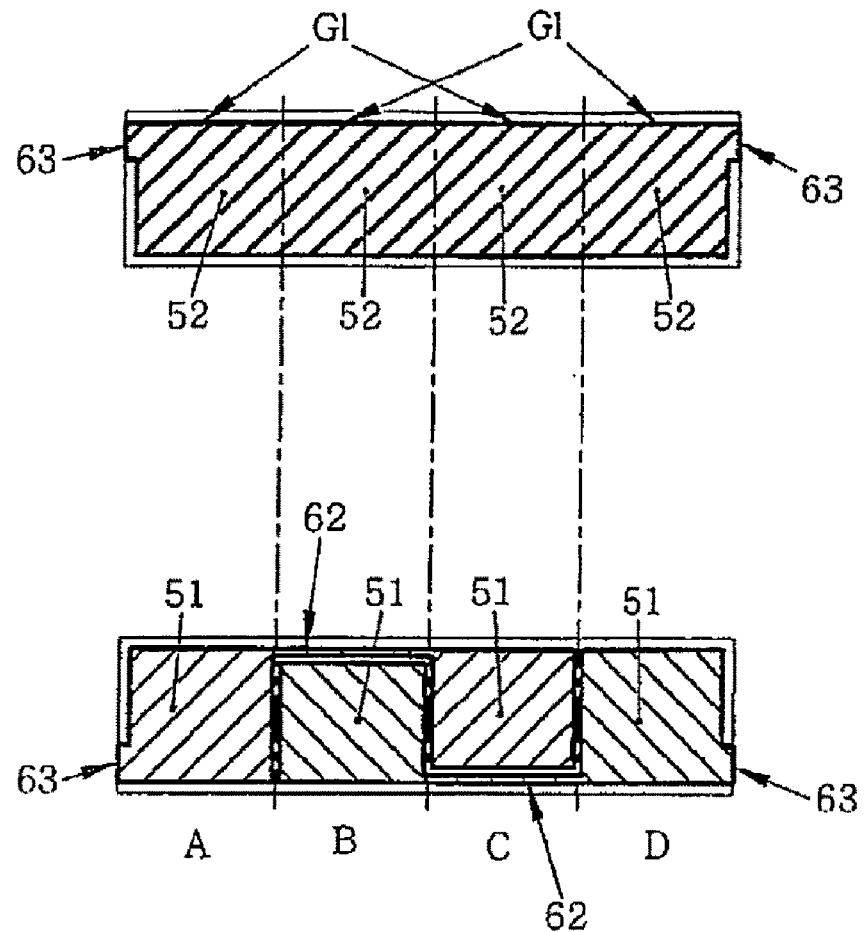
Figure 24:
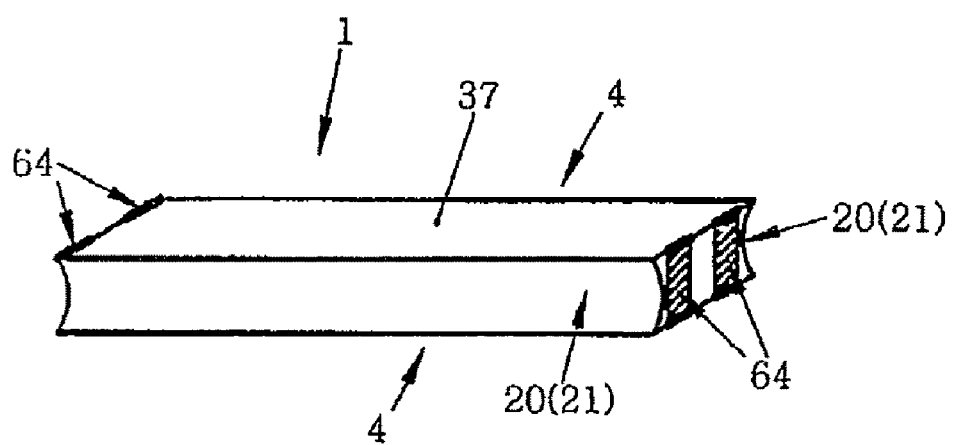
Figure 25:
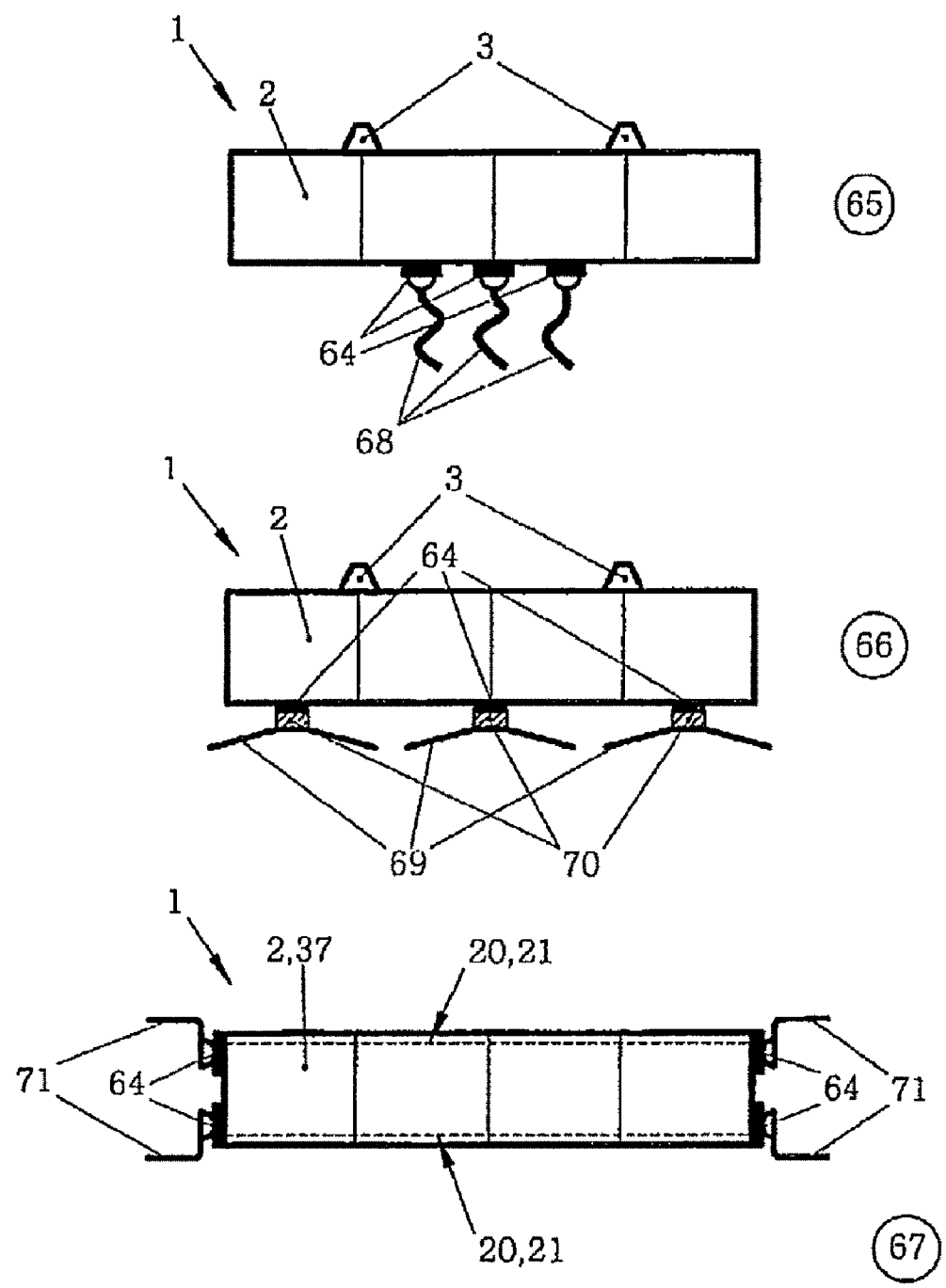
Figure 26:
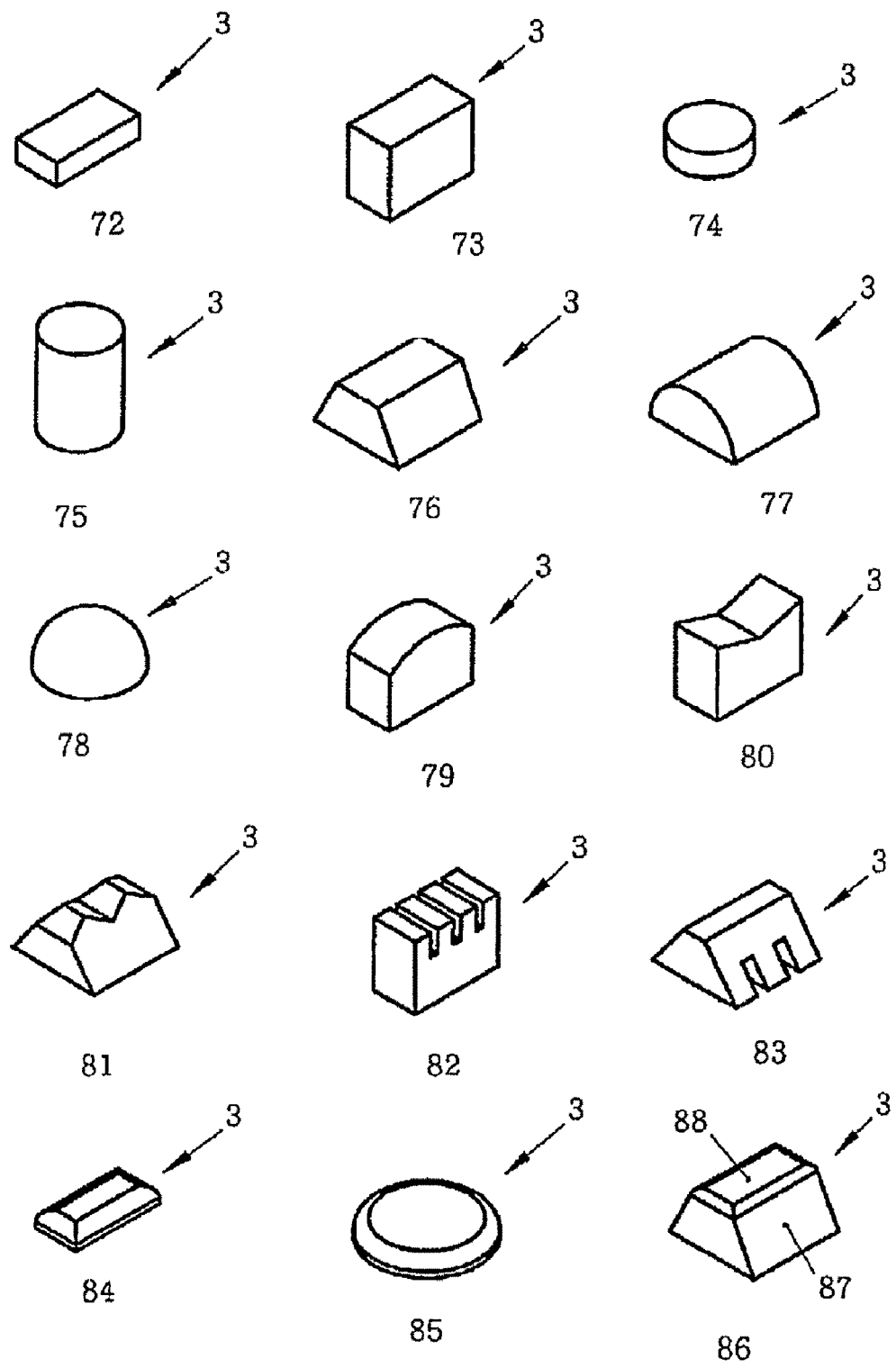
Figure 27:
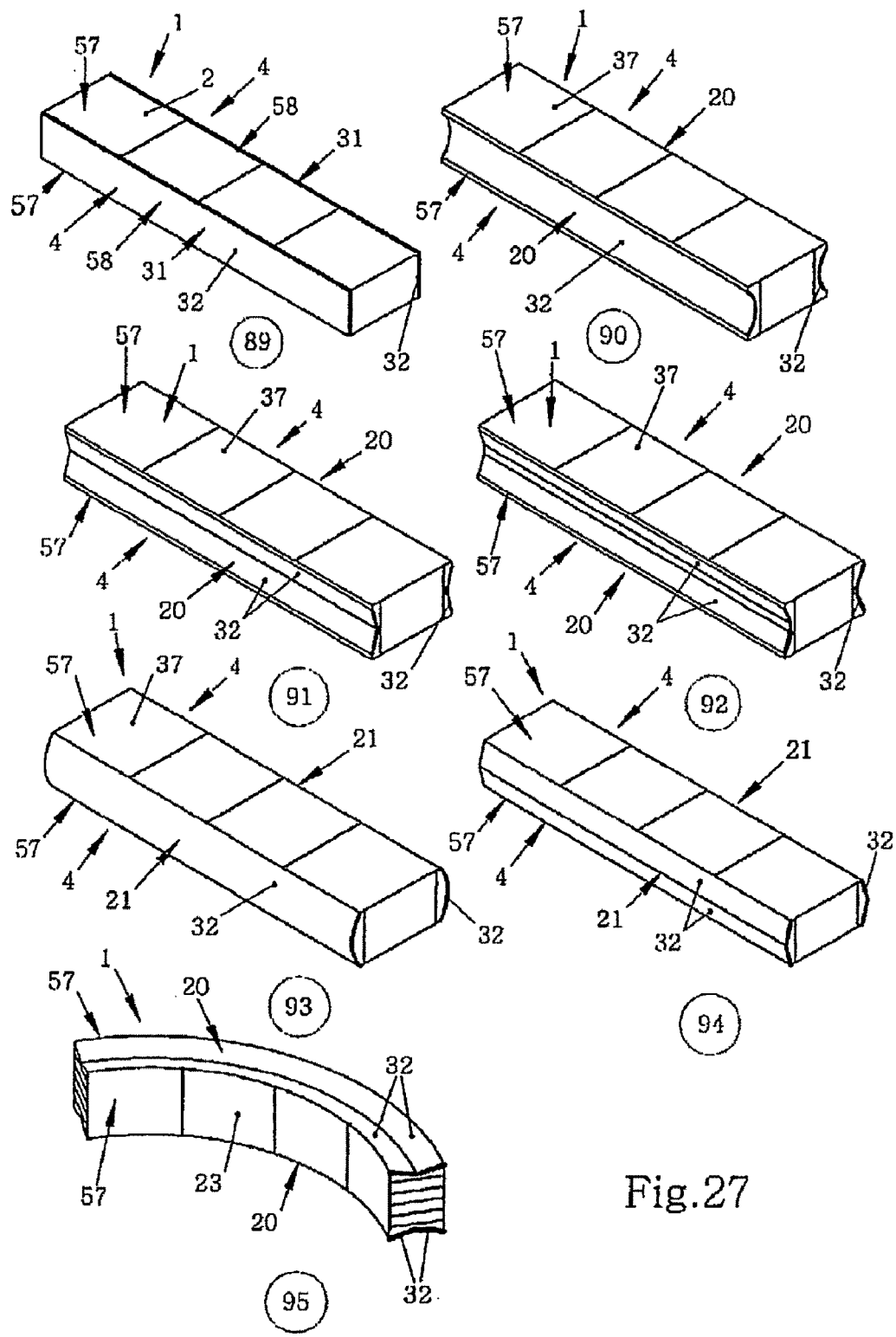
Figure 28:
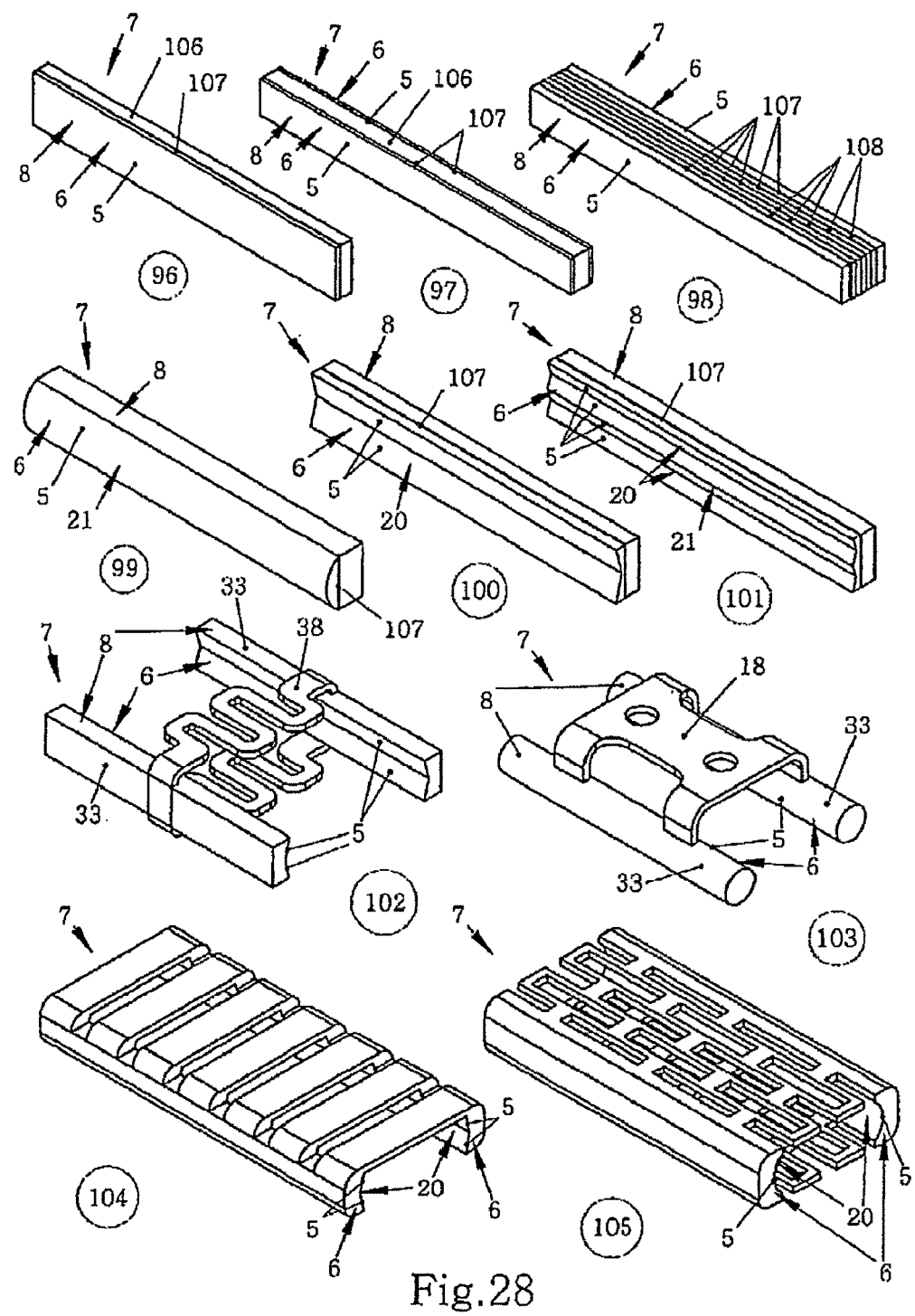
Figure 29:
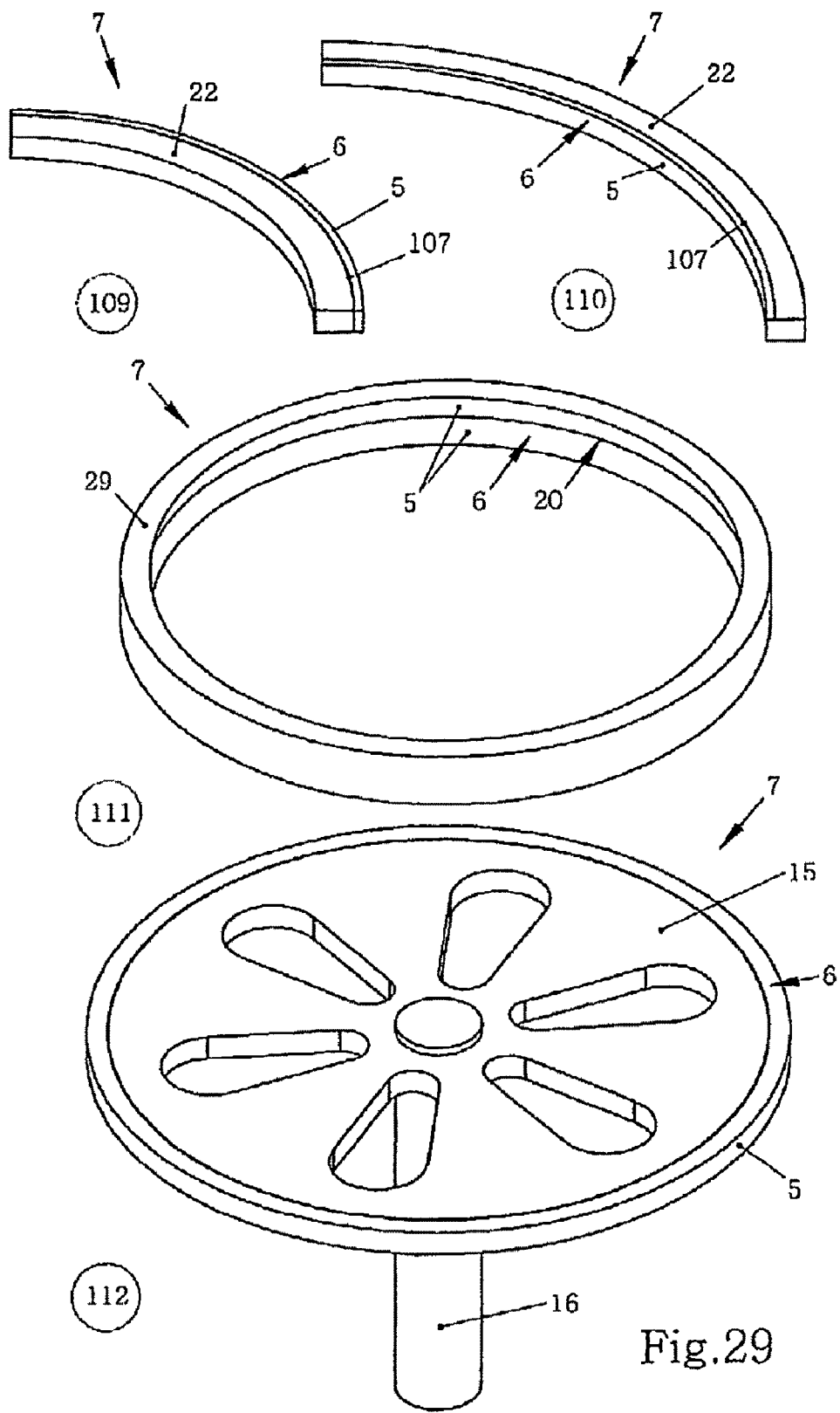
Figure 30:
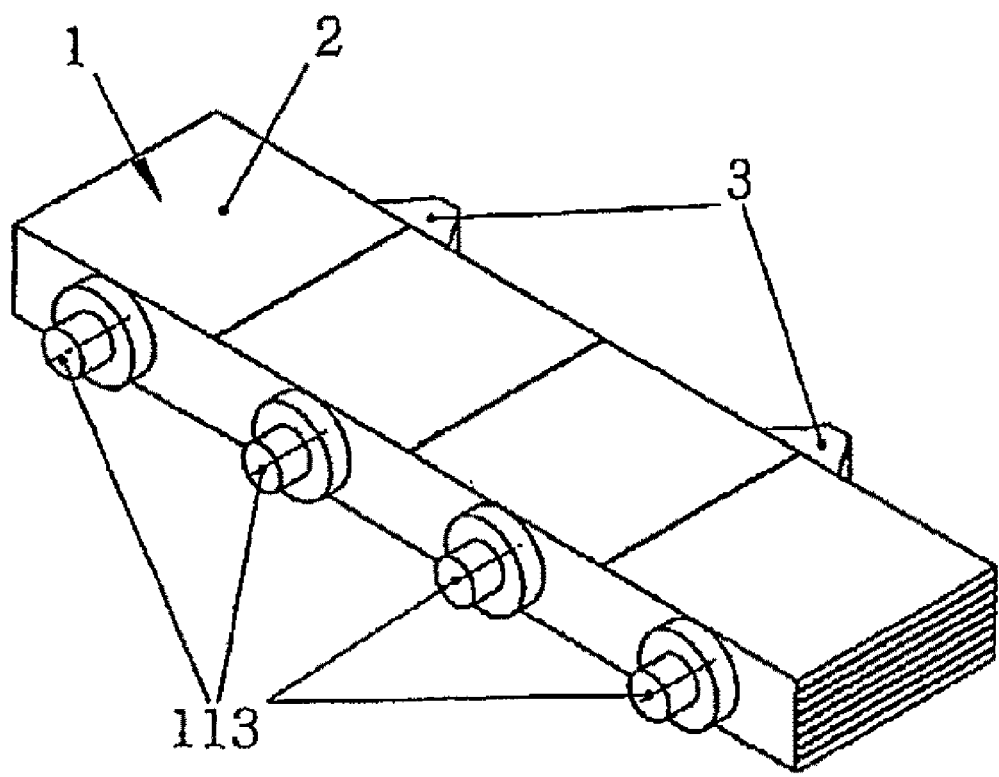
Figure 31:
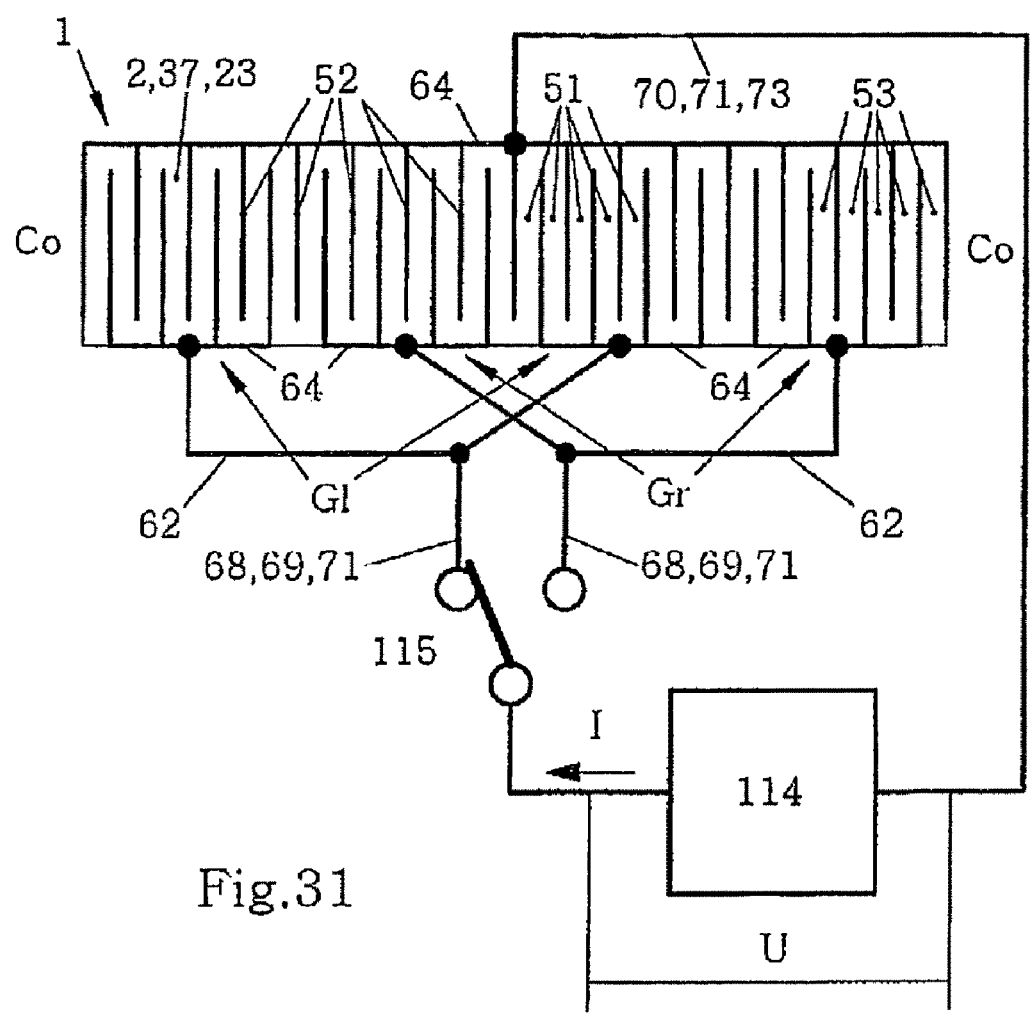
Figure 32:
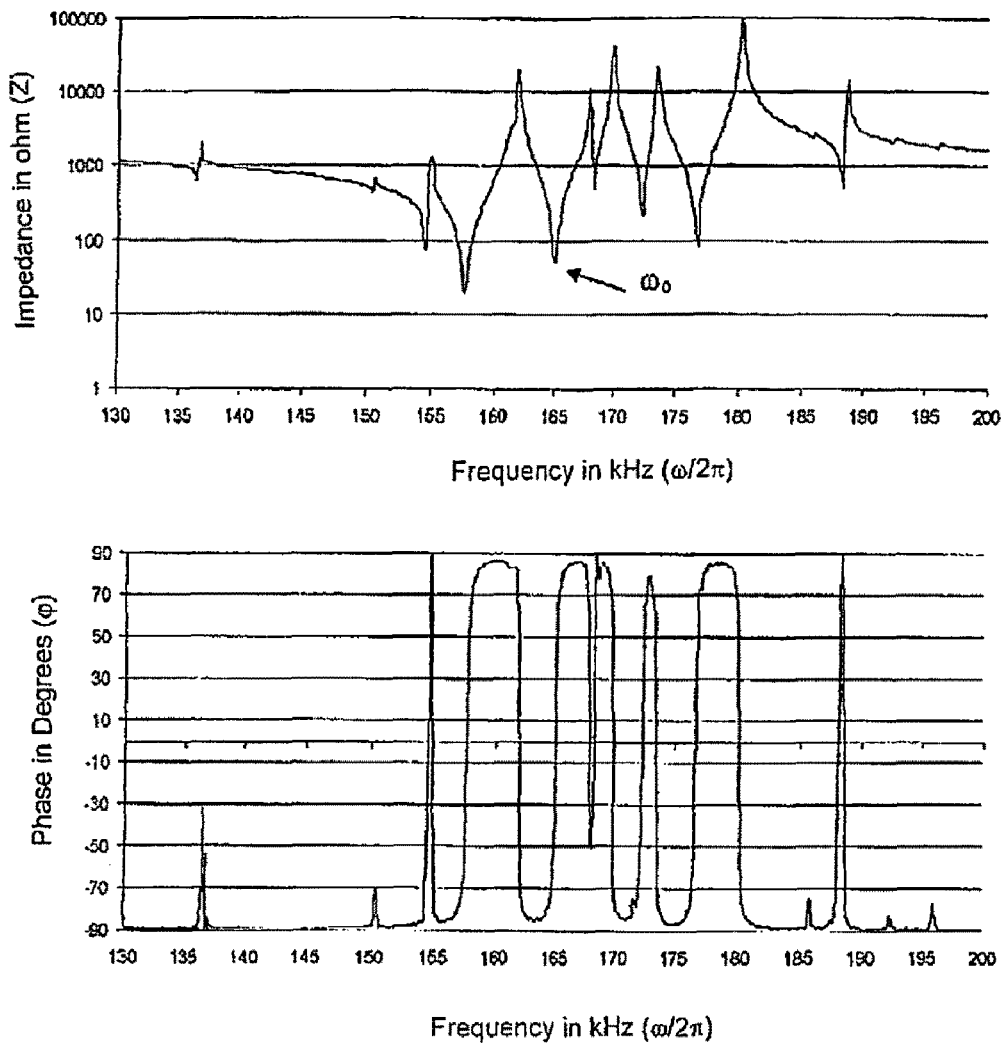
Figure 33:
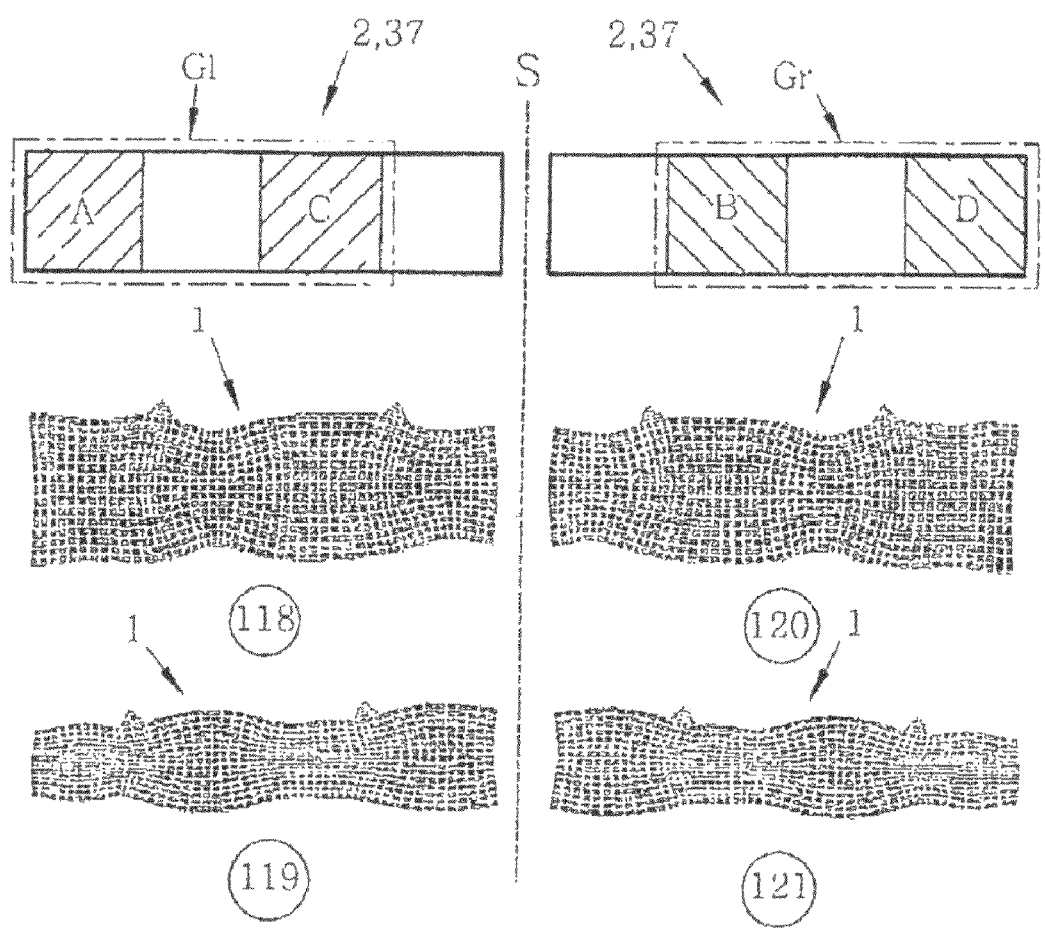
Figure 34:
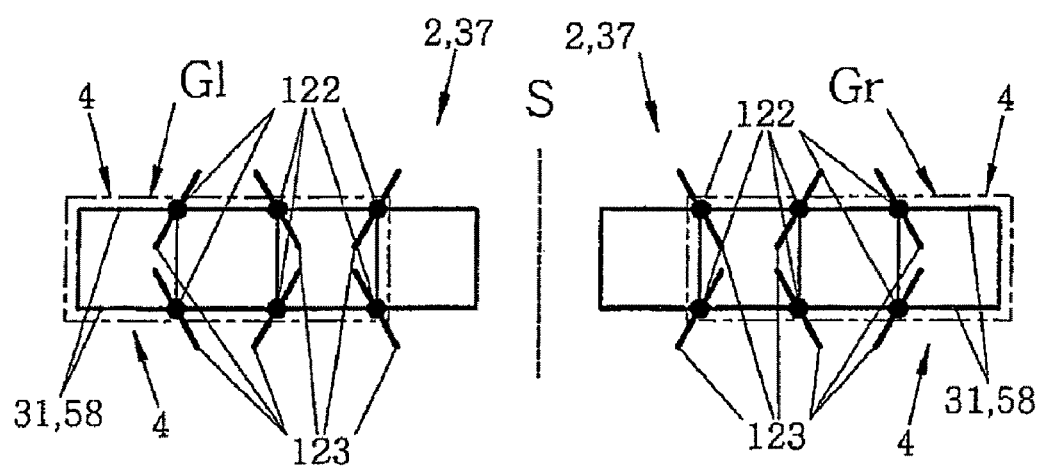
Figure 35:
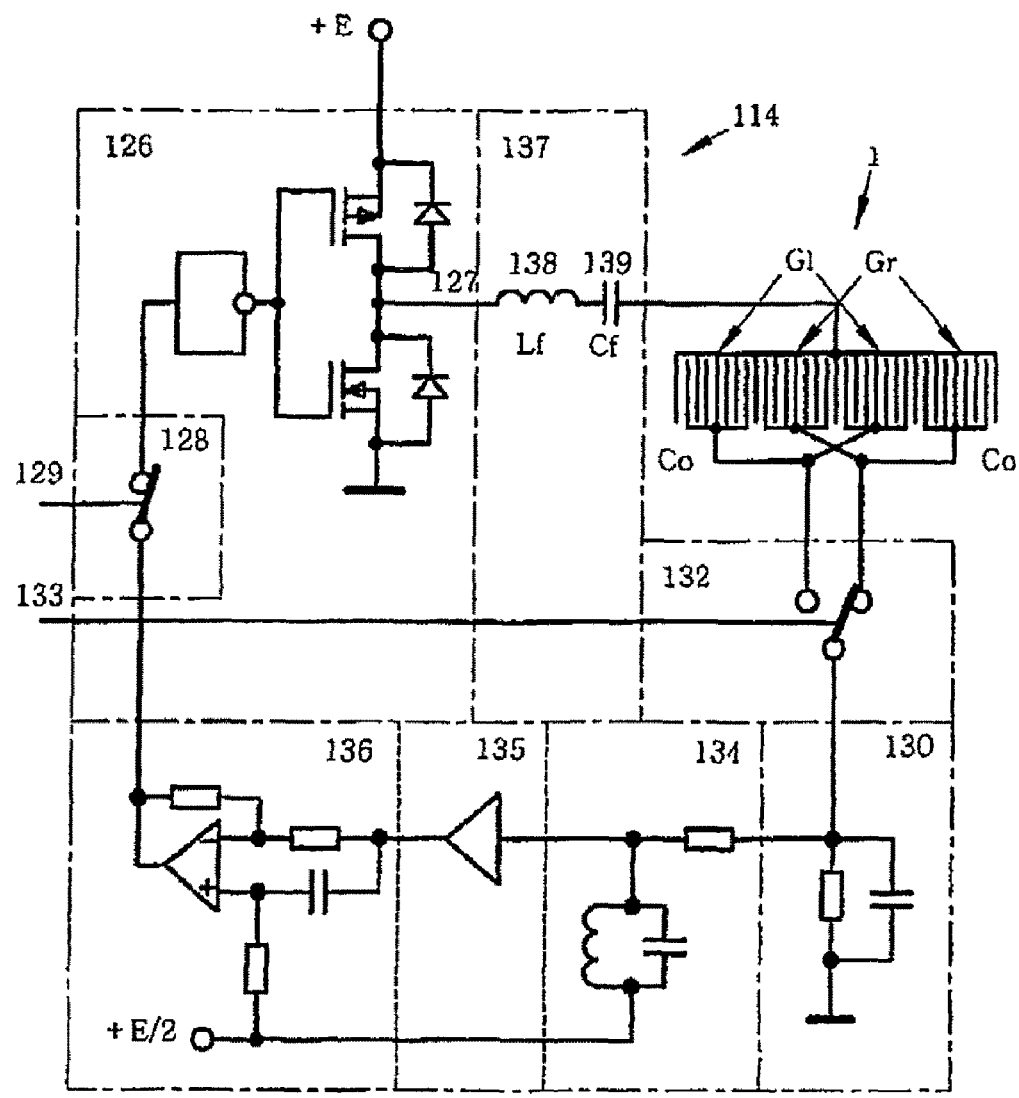

The invention shall be explained in more detail below by means of embodiments and figures. In the figures:

FIGS. 1 ... 15 show embodiment modifications of the proposed ultrasonic motor comprising a multilayer actuator FIGS. 16 ... 19 show drawings for explaining the construction of the generators for ultrasonic oscillations FIGS. 20, 21 show drawings of modifications of the multilayer plate of the actuator of the proposed motor FIG. 22 shows directions of polarization FIGS. 23, 24 show modifications of the electrode configurations FIG. 25 shows modifications of the current-carrying conductors FIG. 26 shows modifications of friction elements FIG. 27 shows modifications of actuators FIGS. 28, 29 show modifications of the driven elements FIG. 30 shows an actuator with holding members FIG. 31 shows a circuit for connecting the multilayer actuator to the excitation source FIG. 32 shows frequency characteristics of the actuator FIG. 33 shows illustrations of the deformations of the actuators FIG. 34 shows illustrations of the paths of motion FIGS. 35 ... 38 show electric circuits of modifications of the excitation source FIG. 1 shows one of the modifications of the proposed ultrasonic motor. The motor is formed of a multilayer actuator 1 realized in the form of a rectangular multilayer plate 2. It is formed of the friction element 3 which is disposed in the central part of its lateral face 4. The friction element 3 is pressed against the friction surface 5 of the abrasion-proof layer 6 of the driven element 7. The driven element 7 constitutes a rod 8 which is arranged in bearings 9. The bearings 9 are located on the base plate 10. The friction element 3 is pressed against the friction surface 5 by means of a pressing device 11 which comprises a leaf spring 12 and the insulating sleeves 13. In this motor modification the insulating sleeves simultaneously form the holding members 14.

Figure 2:
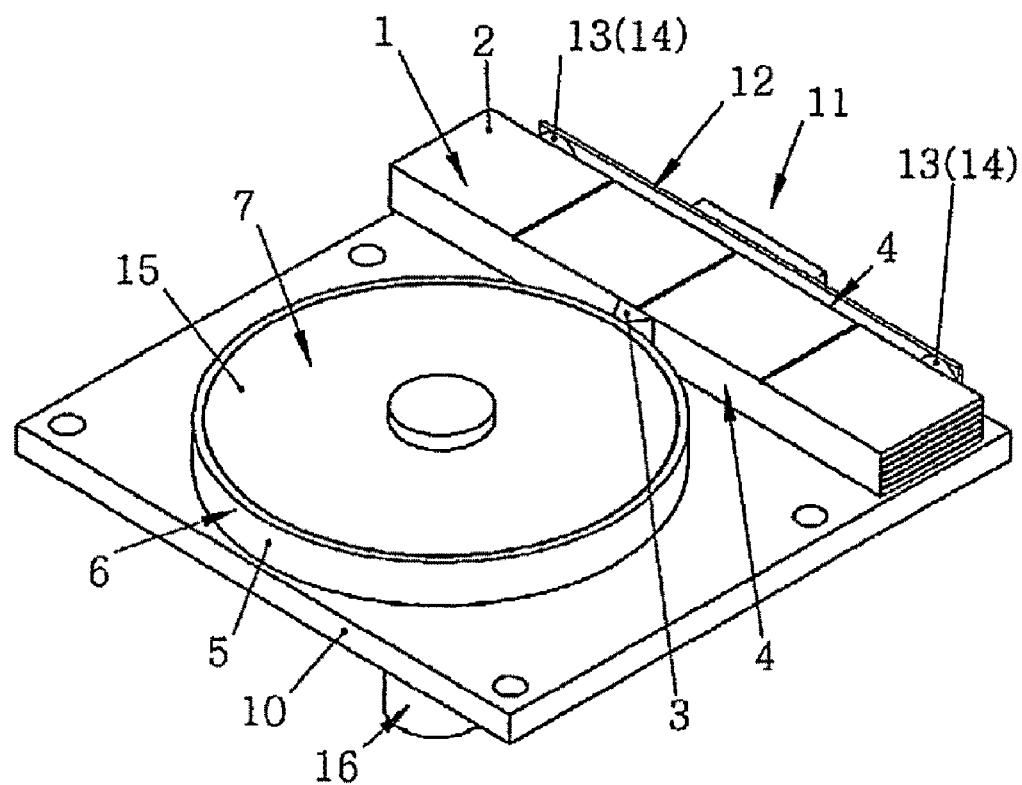

FIG. 2 shows another modification of the proposed motor. In this modification the driven element 7 is realized as a disc 15 mounted on the axle 16. The abrasion-proof layer 6, by means of which the friction surface 5 is pressed against that of the friction element 3 of the multilayer actuator 1, is located on the disc 15.

Figure 3:
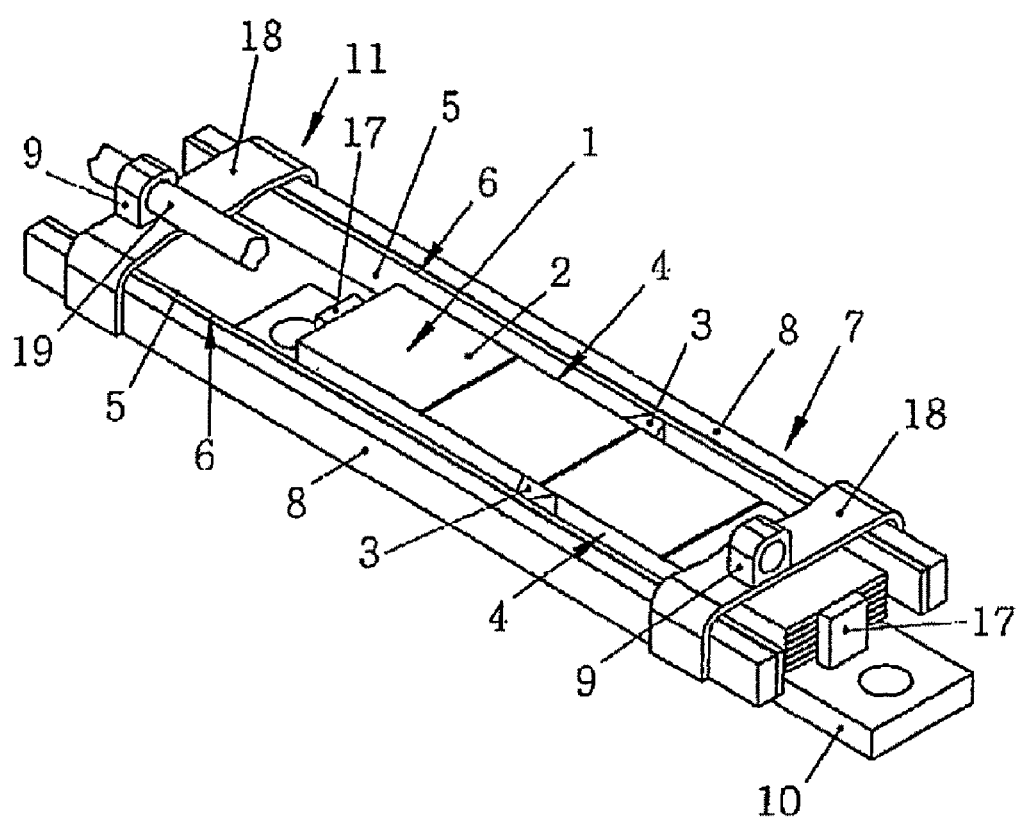

In the modification shown in FIG. 3 the motor comprises two friction elements 3 which are disposed on the two opposite sides 4 of the rectangular multilayer plate 2 of the actuator 1. The multilayer actuator 1 is held by the two abutments 17 which are located on the base plate 10. The driven element 7 of this motor is comprised of two rods 8 which are arranged in parallel and have abrasion-proof layers 6 on the friction surface 5. The pressing device 11 is realized in the form of one or several U-shaped springs 18 which press the friction surfaces 5 of the rods 8 against the friction elements 3.

The driven element 7 comprises the bearings 9 which can be displaced on the guide rod 19.

Figure 4:
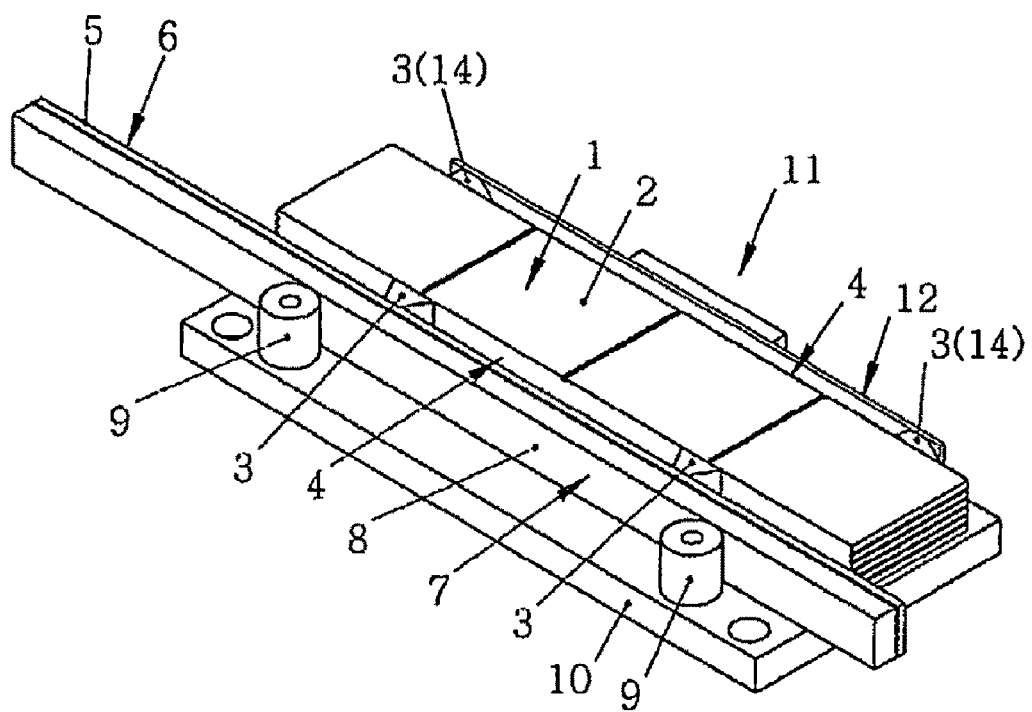

FIG. 4 shows a motor whose multilayer actuator 1 consists of two friction elements 3 disposed on one of the lateral faces 4 of the multilayer plate 2.

Figure 5:
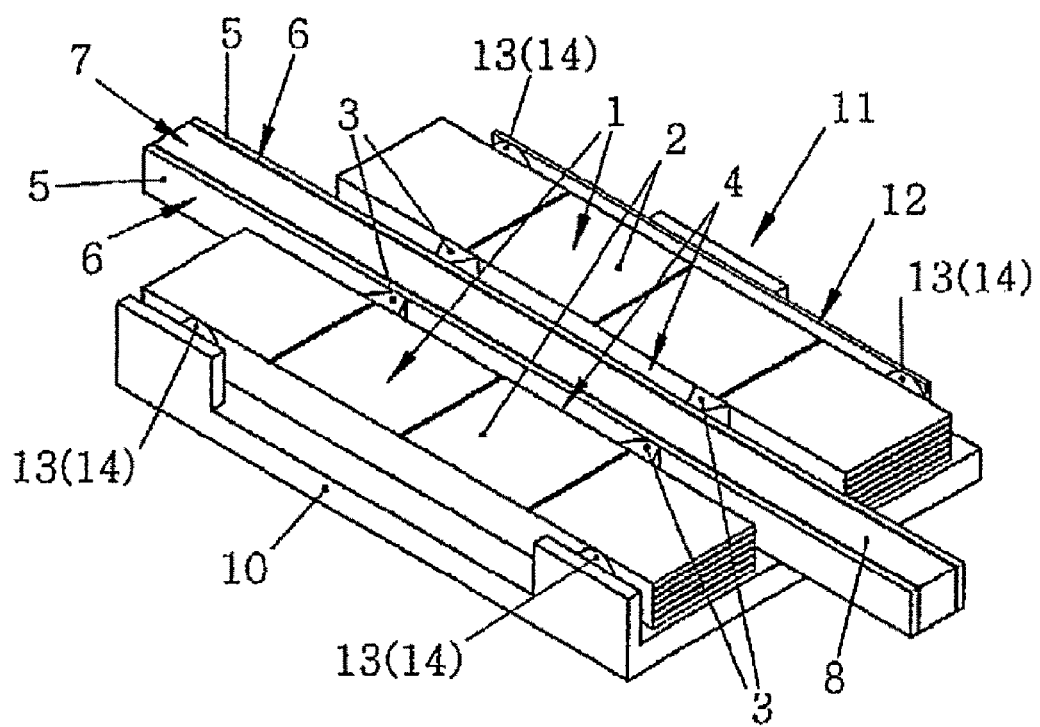

FIG. 5 shows yet another modification of the proposed motor which comprises two multilayer actuators 1 arranged opposite each other and each having two friction elements 3. The driven element 7 of this motor has two friction elements 3. The driven element 7 of this motor is designed as a rod 8 on which two oppositely arranged abrasion-proof layers 6 with friction layers 5 are located.

Figure 6:
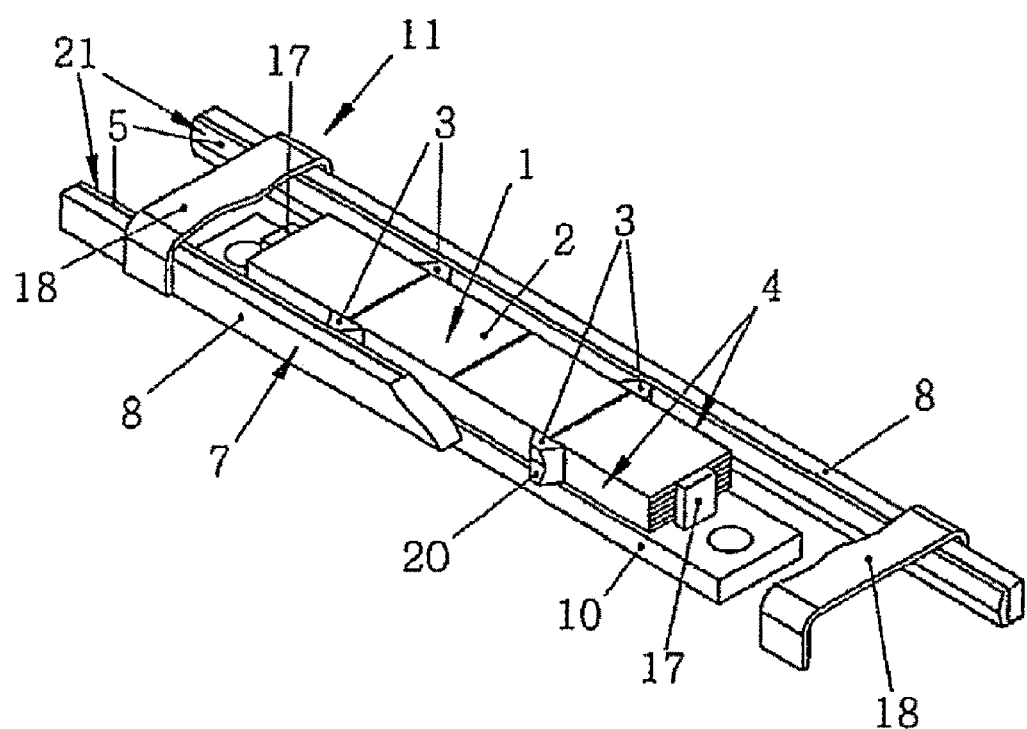

FIG. 6 shows a modification of the motor in which the multilayer actuator 1 comprises four friction elements 3 which are located on the two lateral faces 4. Each friction element 3 includes a guide groove 20 having a V-shaped or any other form.

The driven element 7 of this motor is comprised of two rods 8 which are arranged in parallel and comprise guide rails 21 having a V-shaped or any other form with abrasion-proof layers 6 and friction surfaces 5 on them. The pressing device 11 is realized in the form of one or more U-shaped springs 18 which press the friction surfaces 5 of the rods 8 against the friction elements 3.

Figure 7:
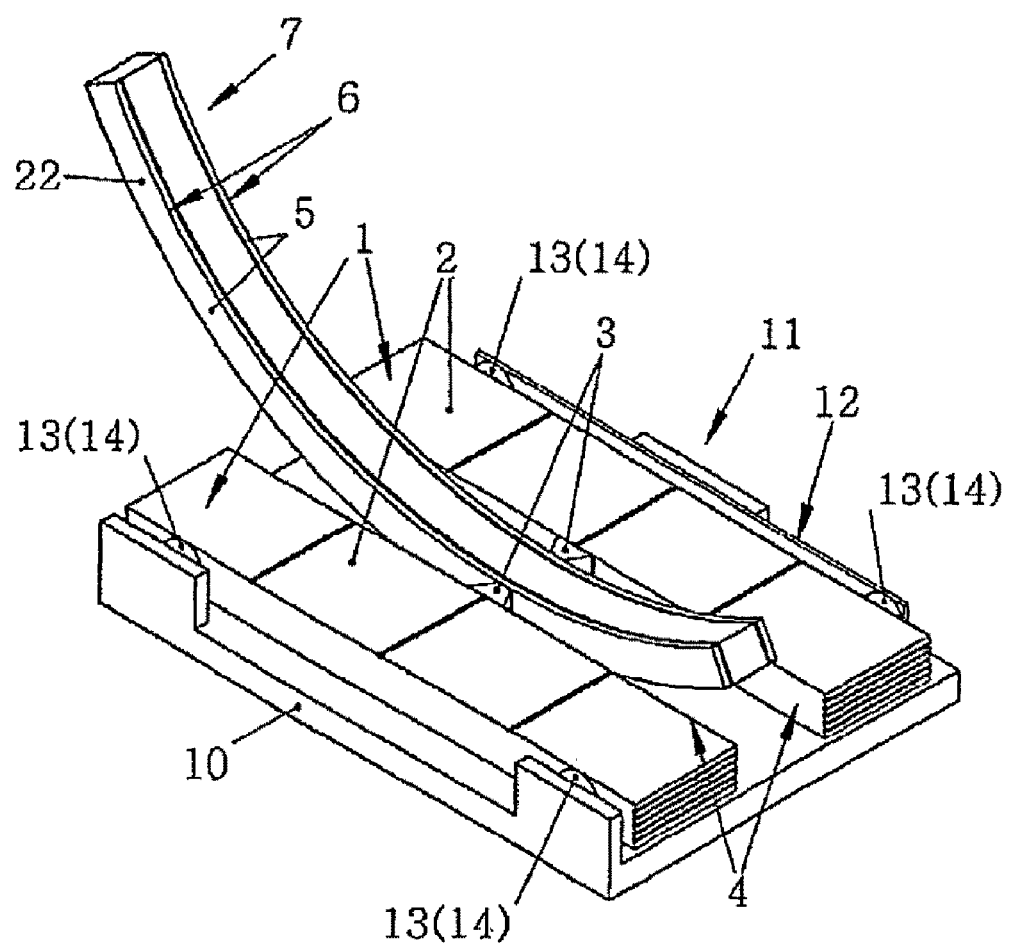

FIG. 7 shows a motor in which the driven element 7 is realized as part of the ring 22. The abrasion-proof layers 6 with friction surfaces 5 are provided on two plane surfaces of the ring 22.

Figure 8:
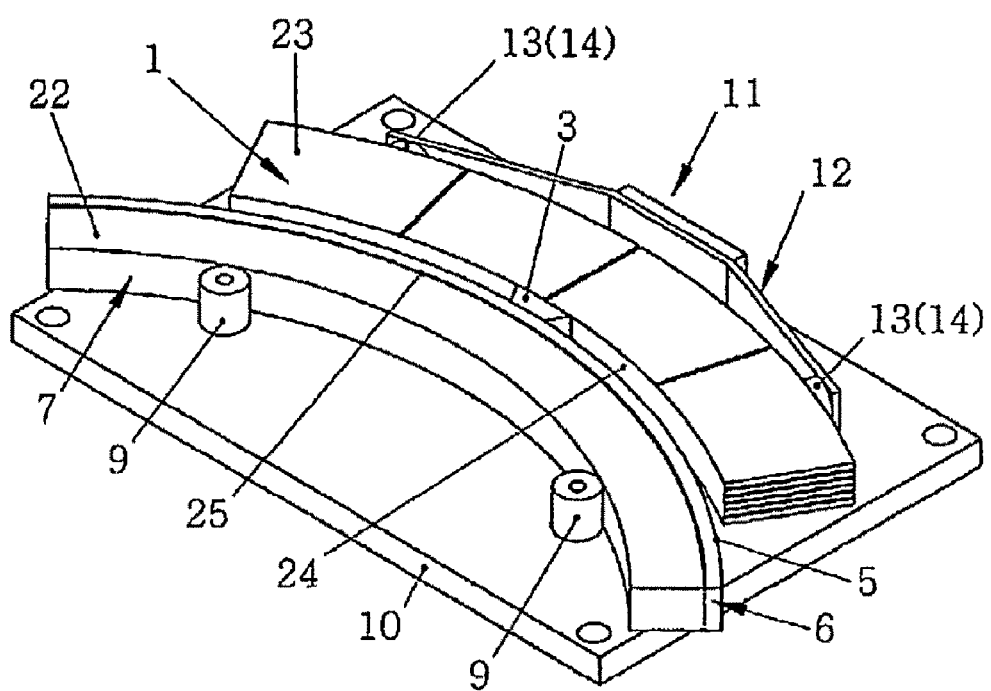

FIG. 8 shows a motor whose multilayer actuator 1 is realized as a multilayer plate which has the shape of a part of the ring 23. The friction element 3 of the actuator 1 is disposed in the central part of the inner cylindrical surface 24.

The driven element 7 of the motor may also have the shape of a part of the ring 25 which is arranged coaxially with the actuator 1. The abrasion-proof layer 6 with friction surface 5 is provided on the outer cylindrical surface 25 of the driven element 7 as part of the ring.

Figure 9:
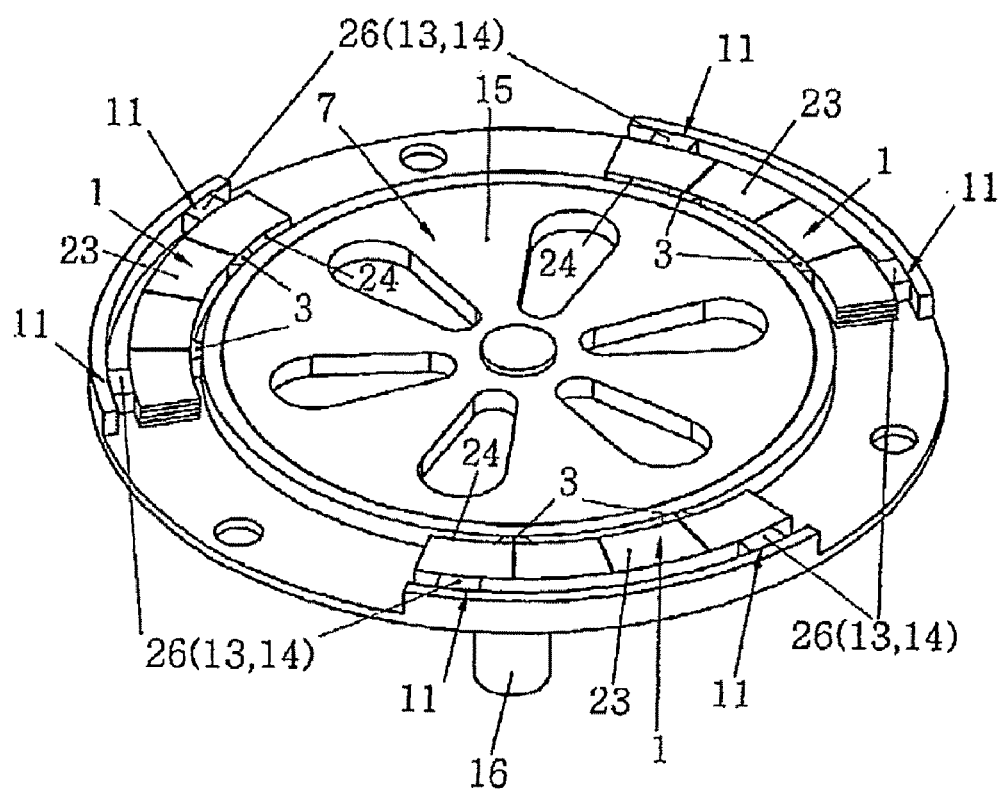

FIG. 9 shows a motor consisting of three coaxially arranged multilayer actuators 1 which are realized as multilayer plates and have the shape of a part of the ring 23. Each of these actuators comprises two friction elements 3 arranged on the inner cylindrical surfaces 24. In this motor, the friction elements are pressed against the friction surface 5 of the abrasion-proof layer 6 by the elastic (resilient) elements 26, which simultaneously assume the functions of the insulating sleeves 13 and the holding members 14. The driven element 7 of the motor is designed as disc 15.

Figure 10:
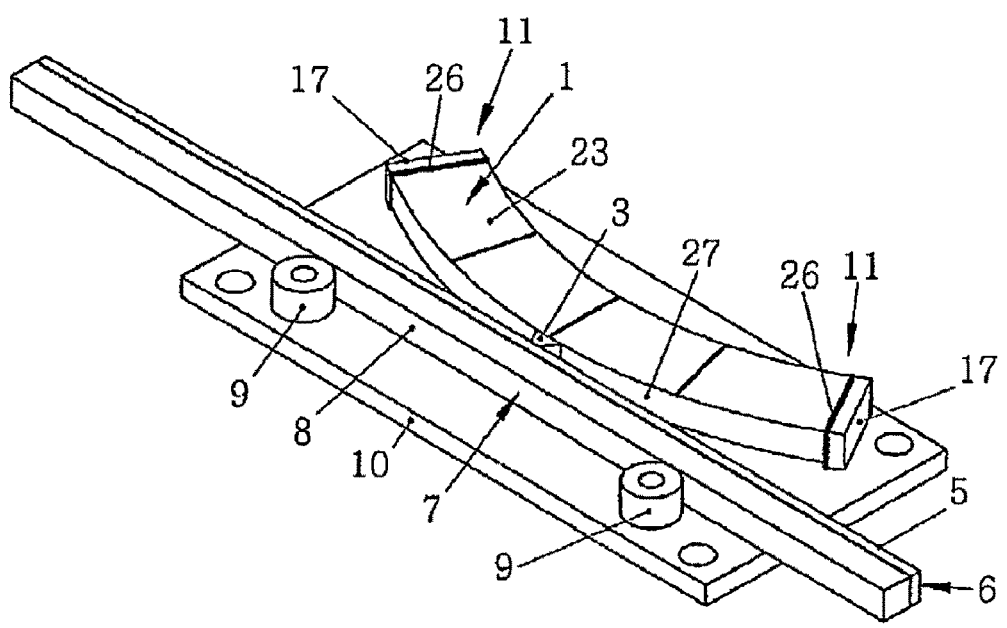

FIG. 10 shows a modification of the proposed motor, comprising an actuator 1 as multilayer plate in the form of a part of the ring 23. The friction element 3 is disposed on the outer cylindrical surface 27 of the actuator 1. The driven element 7 is designed as rod 8.

Figure 11:
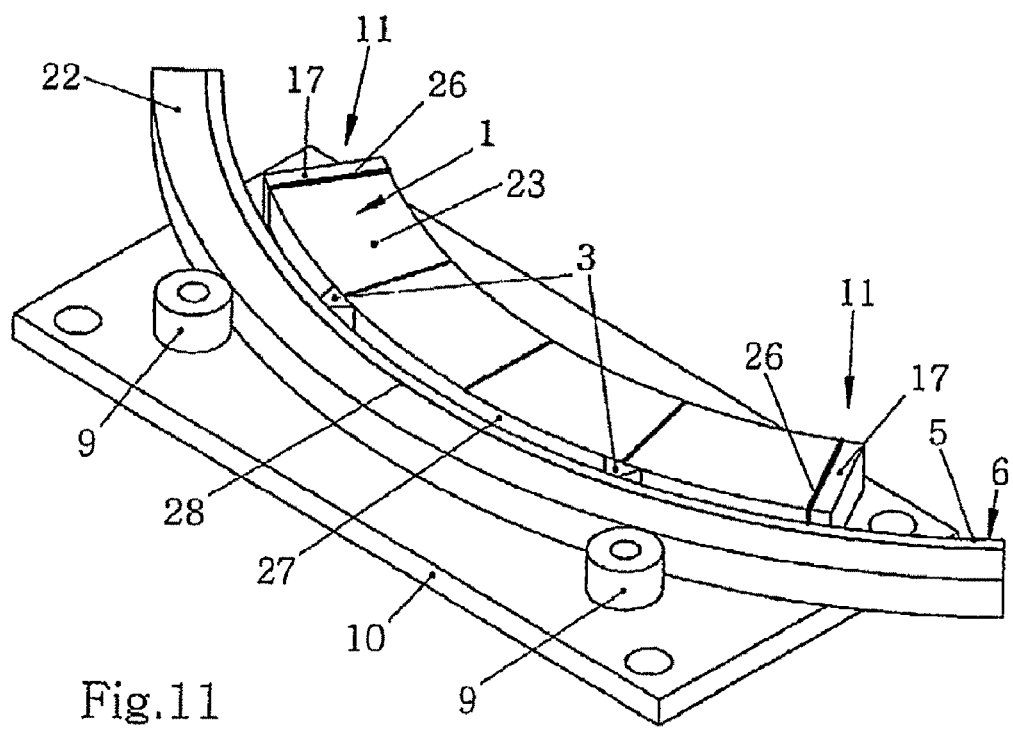

FIG. 11 shows yet another motor modification comprising the actuator 1 as multilayer plate in the form of a part of the ring 23. In this motor, the two friction elements 3 are disposed on the outer cylindrical surface 27 of the actuator 1. The driven element 7 is likewise realized as part of the ring 22 whose abrasion-proof layer 6 is provided on the inner cylindrical surface 28.

Figure 12:
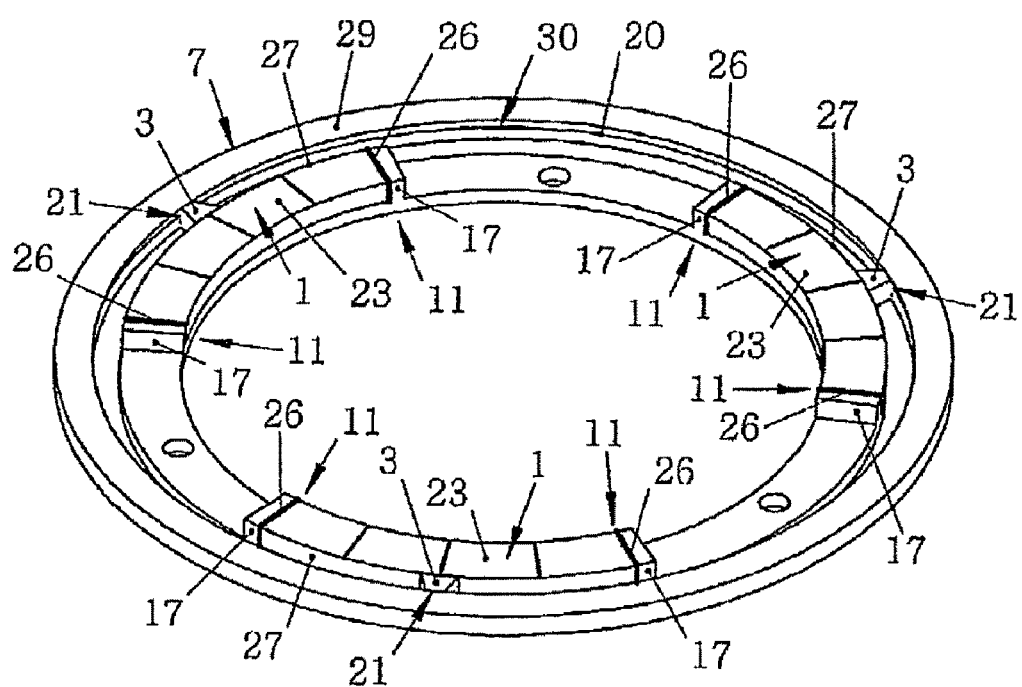

FIG. 12 shows an ultrasonic motor comprising three ultrasonic multilayer actuators 1 each being designed as multilayer plate and constituting a part of the ring 23. Each of the actuators comprises a friction element 3 which is disposed on the outer cylindrical surface 27 of the actuator 1. The driven element 7 of this motor is realized as ring 29 encompassing the actuator 1. On its inner surface 30 the ring 29 has a guide groove 20 of a V-shaped form. In this case, the friction element 3 includes a guide rail 21 of a V-shaped form.

Figure 13:
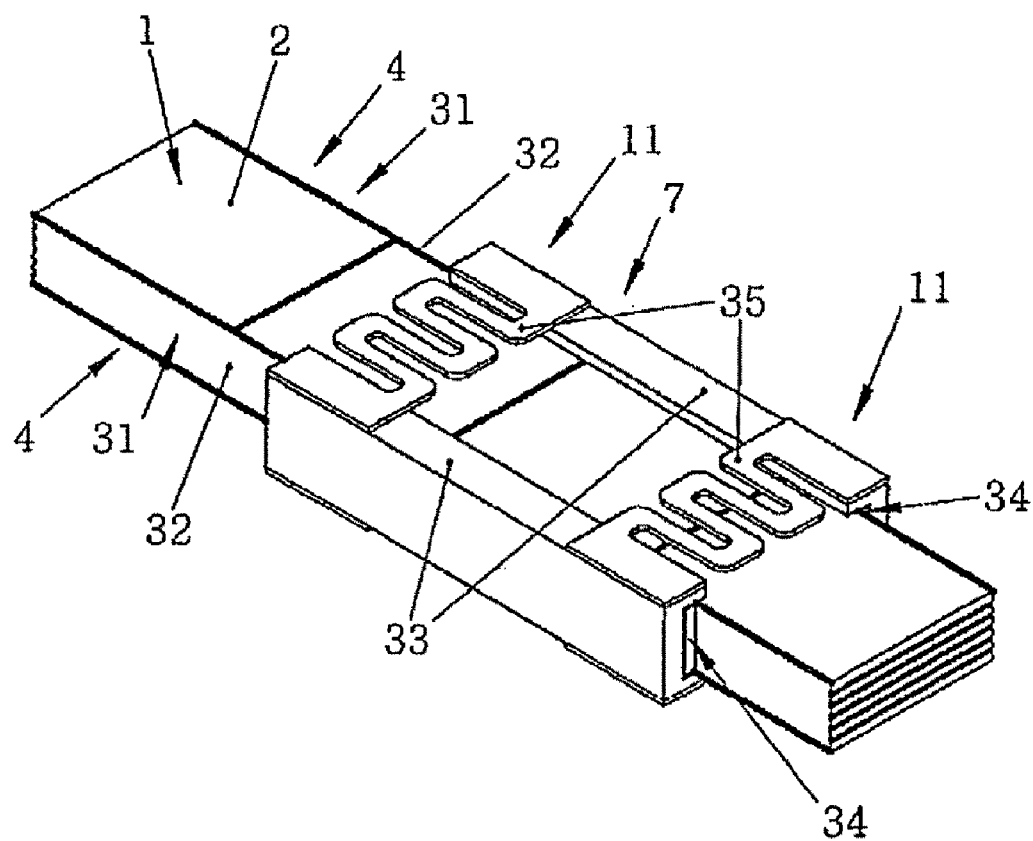

FIG. 13 shows a proposed modification of the ultrasonic motor in which the ultrasonic multilayer actuator 1 is realized as a rectangular multilayer plate 2. The plate 2 comprises the friction layers 32 on the plane surfaces 31 of the lateral faces 4. The driven element 7 of this motor consists of the two slides 33. The slides 33, again, consist of friction plates 34 via which they maintain contact with the friction layers 32. The slides 33 are pressed against the actuator 1 by means of the two-dimensional (flat) formed springs 35 of the pressing device 11.

Figure 14:
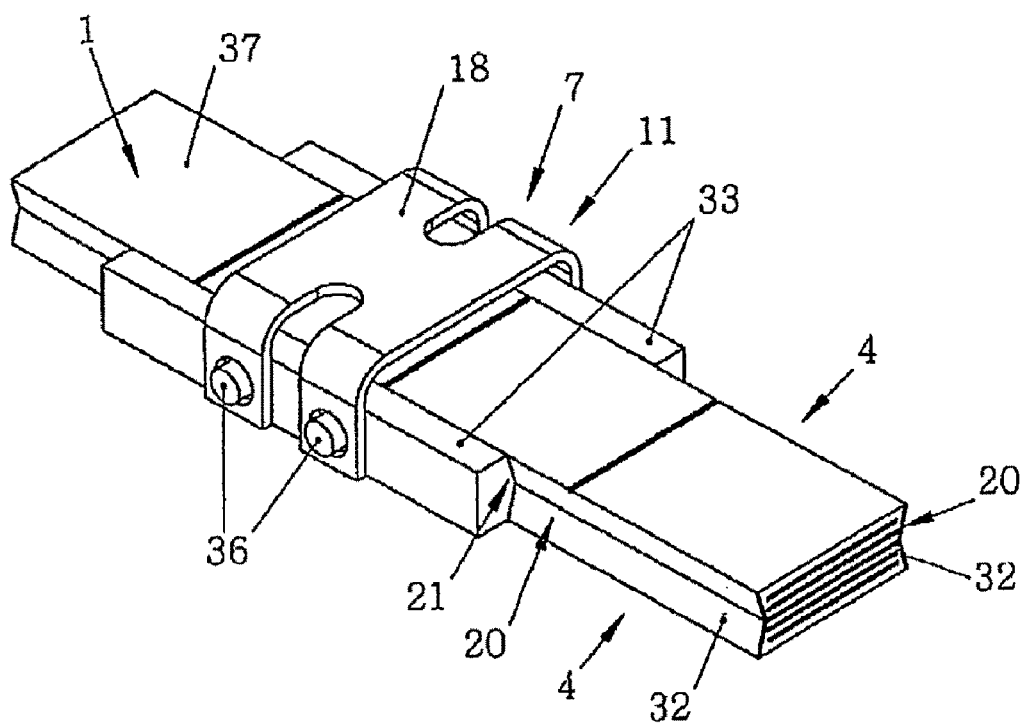

FIG. 14 shows an ultrasonic motor whose slides 33 are pressed against the lateral faces 4 of the multilayer actuator 1 by means of the U-shaped spring of the pressing device 11. The spring 18 holds the slides 33 by means of the pins 36.

In this modification of the motor the lateral faces 4 of the multilayer plate 37 of the multilayer actuator 1 have V-shaped guide grooves on the friction layers 32, on which the slides 33 move with their V-shaped guide rails 21.

Figure 15:
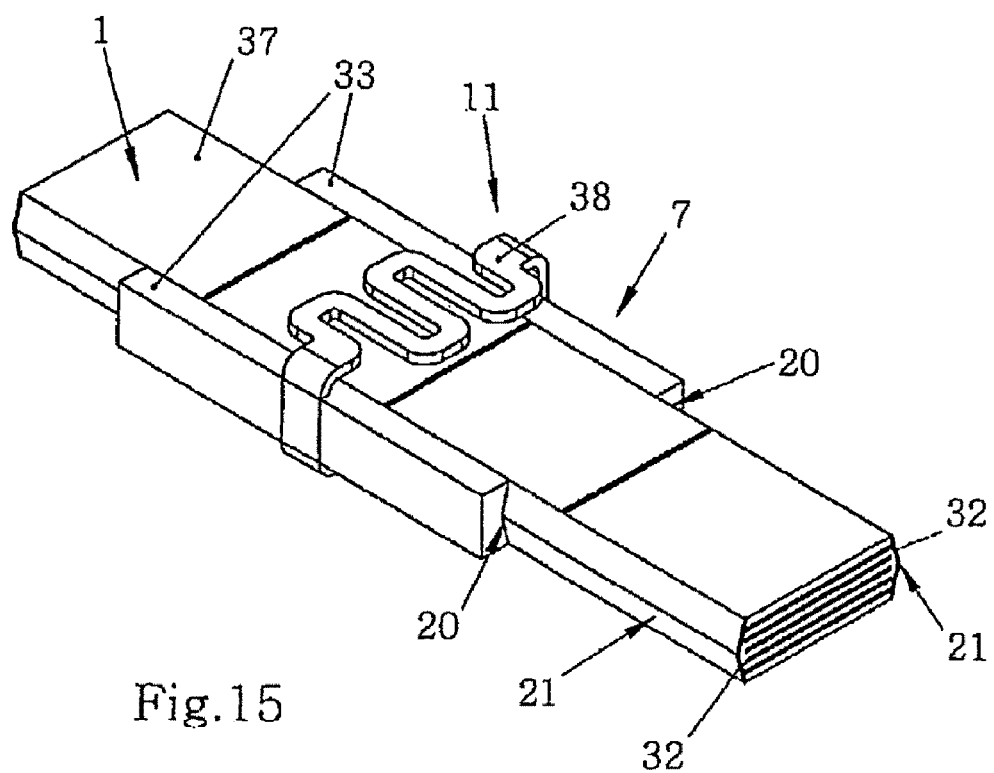

FIG. 15 shows a modification of the ultrasonic motor in which the lateral faces 4 of the multilayer plate 37 of multilayer actuator 1 have V-shaped guide rails 21 on the friction layers 32. The slides 33 are pressed against the guide rails 21 with their V-shaped guide grooves 20. The pressing is accomplished by means of the three-dimensional (volumetric) formed spring 38 of the pressing device 11.

In the proposed ultrasonic motor the length L of multilayer plate 2, 37 or 23 of multilayer actuator 1—relative to the center line (see FIG. 16, positions 39, 40)—is equal to the length of the excited asymmetrical two-dimensional (plane) wave. The height H of the plate 2, 37 or 23 is chosen to be equal to ¼ of L or slightly smaller (0.7 . . . 1) than ¼ of L.

If the plate of the actuator 1 is realized as part of the ring 23 the radius r of this plate—relative to the center line—is chosen to be approximately equal to ¼ of L (see FIG. 16, position 40).

The length L of the multilayer plate 2, 37 or 23 of the actuator 1 is divided into the four zones A, B, C and D, with the length of each zone being ¼ of L (see FIG. 16).

Figure 17:
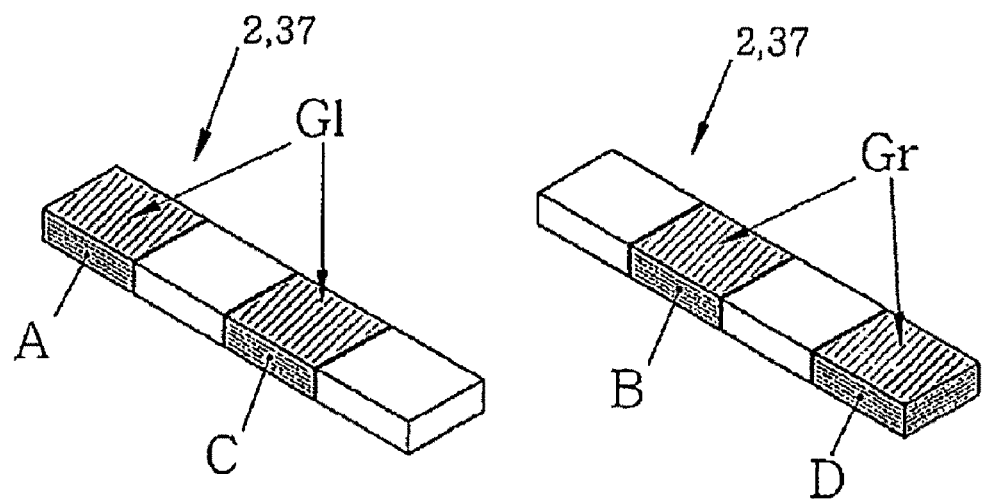
Figure 17:
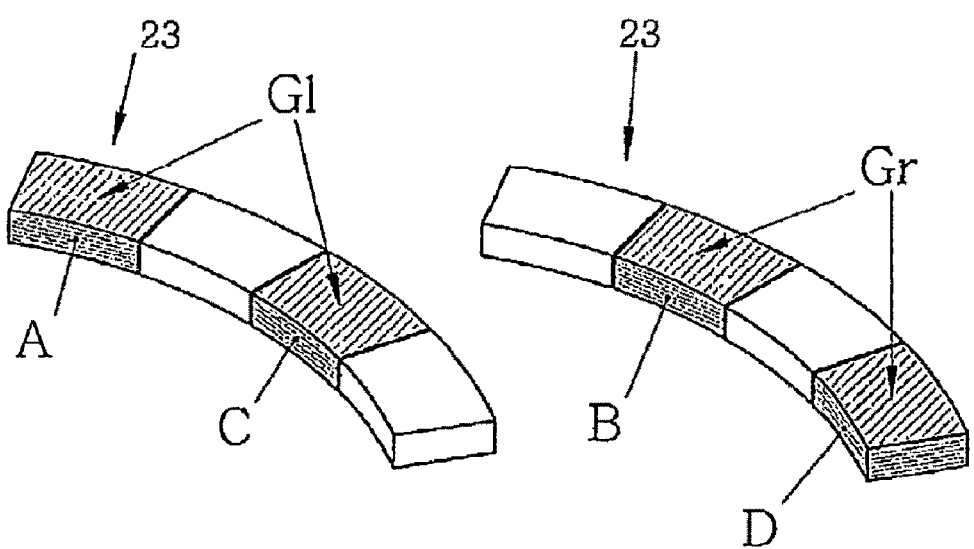

The zones A and C form the generator for ultrasonic oscillations Gl, zones B and D form the generator for ultrasonic oscillations Gr (see FIG. 17, positions 41, 42).

Figure 18:
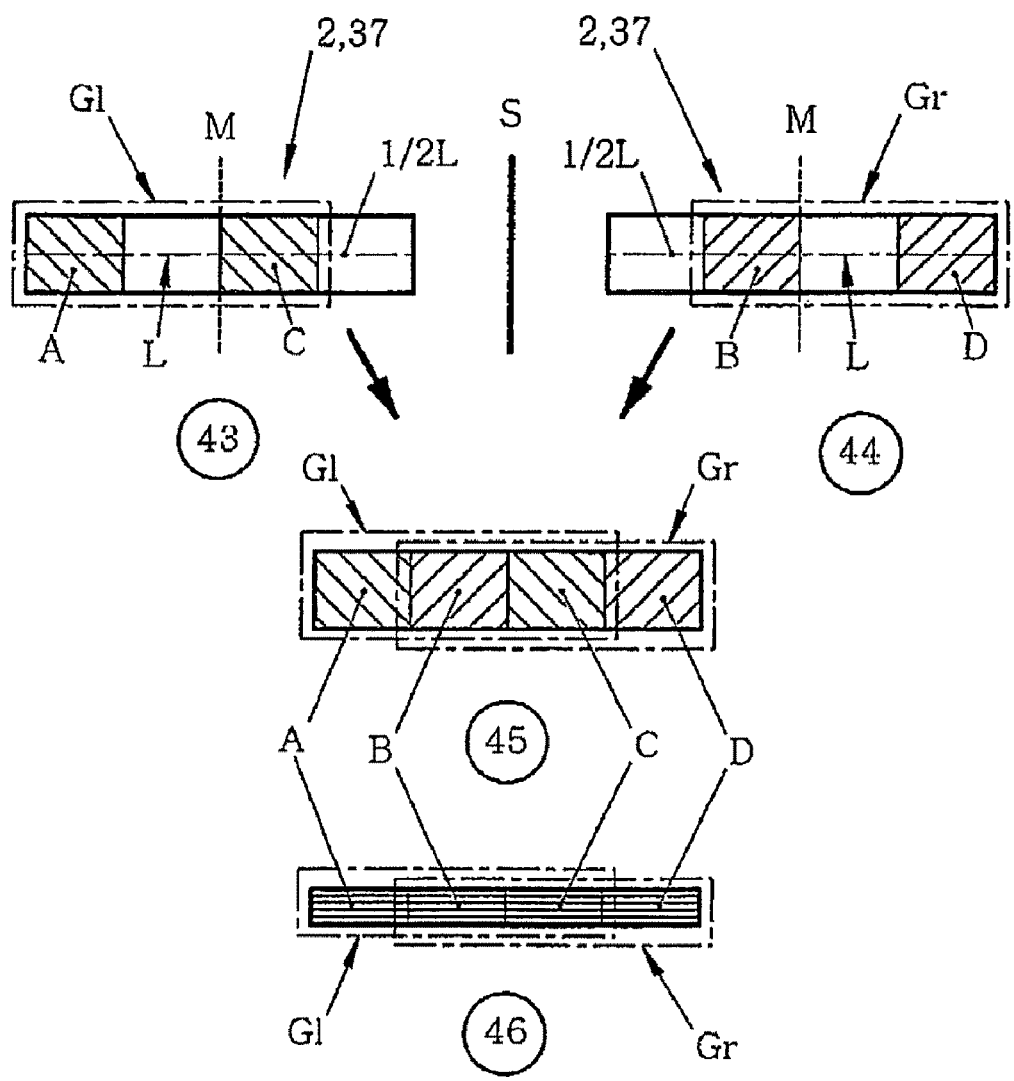
Figure 19:
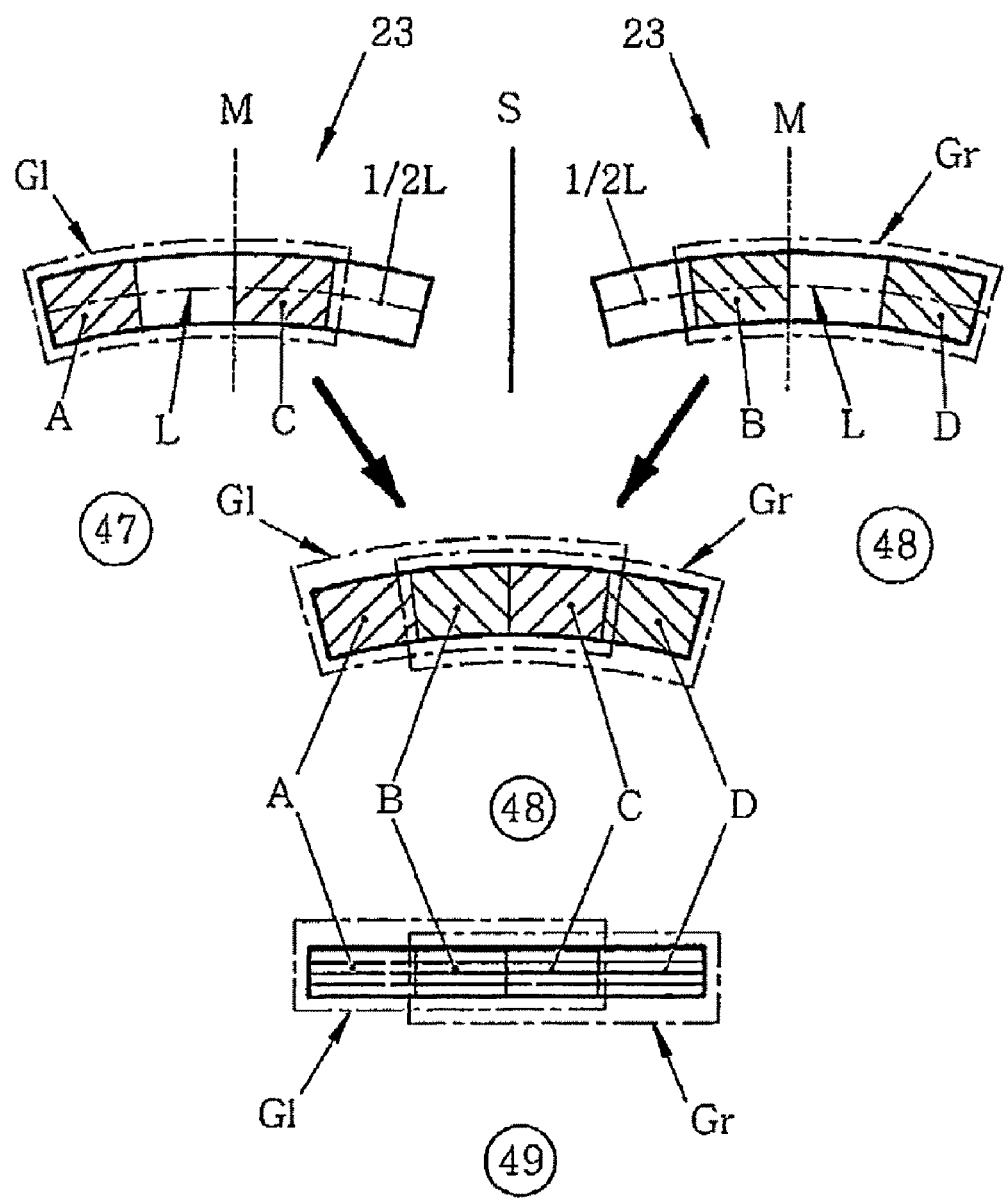

The drawings in FIGS. 18, 19 explain the geometric characteristics of the generators Gl and Gr.

Each of the generators Gl and Gr is arranged asymmetrically—relative to the plane of symmetry M of the plate 2, 37, 23 which extends through the center point of center line L—as is shown in positions 43, 44, 47 and 48. For this reason, the generators Gl and Gr constitute asymmetrical generators.

Each of the generators Gl and Gr is a mirror image of the other generator in the mirror plane S. Plane S extends parallel to the plane of symmetry M at the distance of greater ½ of L. The generators Gl shown in positions 43, 47 are mirror images of the generators Gr shown in positions 44, 48. This applies vice versa in equal measure, whereby the generators shown in positions 44, 48 are mirror images of generators Gl shown in positions 43, 47.

The generators Gl and Gr in the multilayer plate 2, 37, 23 of the multilayer actuator 1 intersect each other, as shown in positions 45, 46, 49, 50 of FIGS. 18, 19. The term "intersect" means that the generators Gr and Gl overlap each other asymmetrically.

Each of the generators Gl and Or consists of layers of excitation electrodes 51 and layers of the general electrodes 52 which alternate with the layers of the piezoelectric ceramics 53 (see positions 54, 55, 56 in FIG. 20).

The thickness of the piezoelectric ceramic layer 53 can amount to 20 . . . 200 micrometers, and the thickness of the metal electrodes 52, 53 can amount to 0.5 . . . 10 micrometers. The piezoelectric ceramics has to have a low production temperature of approximately 800 . . . 1000° C. The metallic layers of the electrodes 52, 53 have to withstand these production temperatures of the piezoelectric ceramics. Palladium or a mixture of palladium and silver may be used as electrode material.

The layers 51, 52, 53 may be arranged parallel to the principal surfaces 57 of the plate 2, 37, 23 (see position 54 of FIGS. 20, 21) or parallel to the lateral faces 59 (see position 53 of FIG. 20).

The arrows in positions 60, 61 of FIG. 22 indicate two of the possible directions of polarization E of the piezoelectric ceramic layers 53 between the electrodes 51 and 51

It is illustrated that the polarization vector extends substantially perpendicular to the surface of the excitation electrodes 51 and the general electrodes 52. In position 60 the polarization vectors are directed away from the general electrode 52, while they are directed towards the general electrode in position 61.

The course of the polarization vectors may be different in different generators.

FIG. 23 shows possible forms of the electrodes 51 and 52 for a multilayer actuator 1 with the friction elements 3 on one of its lateral faces 4.

FIG. 24 shows the possible forms of the electrodes 51 and 52 for a multilayer actuator 1 with the guide grooves 20 on its lateral faces 4.

For simplifying the construction the general electrodes 52 of generators GI and Gr are connected to a compact electrode. The excitation electrodes 51 are connected to each other by the narrow connecting electrode 62. All electrodes comprise projections 63 that serve to connect these electrodes to the contact surfaces 64. In order to prevent electrical breakdowns between the electrodes and surfaces of the multilayer plates 2, 37 and 23 the surface of the plates may be covered with a thin glass layer (not shown in the drawings).

Positions 65, 66, 67 of FIG. 25 show modifications of current-carrying conductors. The cables 68 soldered to the contact surfaces 64 (position 65) can be used as current-carrying conductors. Moreover, leaf springs 69 may be used as current-carrying conductors, which keep contact with the contact surfaces via the spacers 70 made of conductive rubber (position 66). The leaf springs 69 can simultaneously be used in the pressing device 11 to generate the force that presses the friction elements 3 against the friction surface 5. Also, elastic metallic lamellae 71 may be used as current-carrying conductors which, at the same time, hold the actuator (position 67).

Positions 72 ... 86 in FIG. 26 show the friction elements 3. The friction elements 3 (see positions 72 ... 83) are made as monolithic elements of an abrasion-proof material, such as oxide ceramics with aluminum oxide, zirconium oxide, ceramics with silicon nitride, silicon carbide, metal ceramics with tungsten carbide, titanium nitride or from any other similar, solid, abrasion-proof ceramics. Furthermore, the friction elements 3 can be made of monocrystalline materials that contain aluminum oxide, e.g. sapphire, ruby, or of any other hard, abrasion-proof monocrystals. The monolithic friction elements 3 may also be made of materials on the basis of hard glasses, or glasses enriched with abrasion-proof particles, e.g. aluminum oxide, silicon carbide and the like.

The friction elements 3 shown in positions 72 ... 83 are welded onto the multilayer plate 2 by means of an organic high-temperature adhesive or by means of low-melting glasses.

The friction elements 3 shown in positions 72 ... 83 may also be made of high temperature resistant plastics, enriched with particles of a hard abrasion-proof material.

The friction elements 3 shown in positions 84, 85 are made by melting abrasion-proof glass or glass enriched with particles of an abrasion-proof material onto the multilayer plate 2.

Position 86 shows the double-layer friction element 3. The lower layer 87 of the friction element is made of a material whose modulus of elasticity and temperature expansion coefficient are close to the modulus of elasticity and temperature expansion coefficient of the multilayer plate 2. For instance, a non-polarized piezoelectric ceramics can here be used. The material of the upper layer 88 must have a great strength and great abrasion resistance. This layer can be made of abrasion-proof glass, of a thin layer of oxide ceramics or of another hard abrasion-proof ceramic material.

Positions 89 ... 95 in FIG. 27 show other modifications of the actuator 1, whose multilayer plate 2, 37 or 23 comprises the friction layer 32 on its lateral faces 4.

This friction layer 32 can be made, for instance, as a thin plate of a hard abrasion-proof material, such as oxide ceramics, metal ceramics, glass or glass enriched with particles of an abrasion-proof material. Moreover, the layer 32 can be a thin abrasion-proof plate produced as diamond polycrystals by vapor-depositing or depositing from a gaseous medium of substances like Ti, Cr, TiN, TiCN, TiC, CrN, TiAlN, ZrN, TiZrN, TiCrN or C. The friction layer 32 can constitute a thin graphite layer or a layer of molybdenum disulfate, which is applied to the surface of the lateral faces 4 of the actuator 1 by friction or any other suited method.

The friction layer 32 of the actuator 1 shown in position 89 is located on the plane surface 31 of the lateral faces 4 of plate 2. The plates 37 of the actuators 1 shown in positions 90 ... 95 have round, V-shaped and trapezoidal guide grooves 20 or guide rails 21 applied to their lateral faces 4. In another modification the guide grooves 20 and guide rails 21 are located on friction layer 32 which is realized as a thin plate. In yet another modification the friction layer 32 can be fabricated as a layer applied to the surface of the guide grooves 20 or guide rails 21, which thus form part of the multilayer plate 37.

Positions 96 ... 105 in FIG. 28 show some of the possible modifications for the driven elements 7.

The driven elements 7 may be realized as rods 8 (positions 96 ... 97) made of an elastic holding plate 106 and one or two abrasion-proof layers 6 with the friction layer 5.

The abrasion-proof layers 6 can be made as thin plates of a solid abrasion-proof material, such as oxide ceramics, metal ceramics, glass or glass enriched with particles of an abrasion-proof material, or of hard abrasion-proof plastics. They have a smooth friction surface 5 and are connected to the holding plate 106 by means of the thin sound-insulating layer 107.

The driven element 7 may have a multilayer structure in which the thin sound-insulating layers 107 are arranged alternately with the thin elastic plates 108 (position 98).

The abrasion-proof layers 6 of the driven element 7 may comprise a guide rail 21 (position 99), a guide groove 20 (position 100) or alternately arranged guide rails 21 and guide grooves 20 (position 101). The guide rails 21 and guide grooves 20 may be realized in a round, V-shaped or any other form.

Positions 102 and 103 in FIG. 28 show assembled driven elements 7. These driven elements 7 have two rods 8 held together by means of springs 38 or 18. The rods 8 of these driven elements 7 can be fabricated from hard abrasion-proof plastics by means of injection molding. The springs 38, 18 can be integrated in the bodies of the rods 8 as they are cast.

Positions 104, 105 in FIG. 28 show modifications of monolithic driven elements 7 which are entirely made of plastic materials, e.g. by means of injection molding.

In either case those plastics are well-suited whose basis is formed by semicrystalline polyacrylamide, enriched with a glassy phase containing aluminum oxide particles or particles of another abrasion-proof material.

Positions 109, 110, 111, 112 in FIG. 29 show driven elements realized as parts of the ring 22, as ring 29 and as disc 15.

FIG. 30 shows an actuator 1, a multilayer plate 2 with holding members 113.

FIG. 31 shows the electric circuit which connects the actuator 1 to the electric excitation device 114. The circuit comprises a changeover switch for the generators 115. The electric excitation device 114 provides a sinusoidal excitation voltage U with the frequency $\omega_0$. Due to this voltage the sinusoidal current I flows through the actuator 1. The electric capacitance $C_0$ is formed between the excitation electrodes 51 and the general electrodes 52, which simultaneously represents the input capacitance of actuator 1.

FIG. 32 shows the frequency dependence of the electrical impedance Z of the generator GI or Gr of the actuator 1 (position 116) and the frequency dependence of the phase shift $\phi$ between the excitation voltage U and the current I flowing through the actuator 1 (position 117). The dependences apply to the actuator 1 realized as rectangular plate 2 and having the dimensions L=50 mm, H=10.5 mm, D=4 mm. $\omega_0$ represents the operating frequency of the actuator 1.

FIG. 33 depicts images of the maximum deformation of the plate 2, with □0 being the operating frequency of the actuator 1. Positions 118, 119 depict images of the deformation of the plate 2 when driven by generator GI. Positions 120, 121 depict images of the deformation of the plate 2 when driven by generator Gr.

FIG. 34 shows the paths of motion 122 of the material points 123 which are located on the surfaces 31 (58) and 59 of plate 2 when driven by generator GI (position 124) and when driven by generator Gr (position 125).

FIG. 35 shows the block diagram of the electric excitation device 114 of the actuator 1, including additional electrical components. The block diagram is formed of the pulse power amplifier 126 with output 127, the on-off switch 128 with control input 129, the feedback element 130, the feedback circuit 131 and the controllable changeover switch 132 with control input 133.

The power amplifier 126 can be realized as a half-bridge amplifier (see FIG. 35) or bridge amplifier. If a bridge amplifier is used, a matching transformer has to be applied (not shown in the figures). The feedback circuit 131 can consist of the voltage filter 134, the amplifier of the feedback circuit 135, the phase shifter 136.

The actuator 1 is connected via the output filter 137, which is formed of the inductance coil 138 with the inductance $L_f$ and the capacitor 139 with the capacitance $C_f$, to the output 127 of the amplifier 126.

Figure 36:
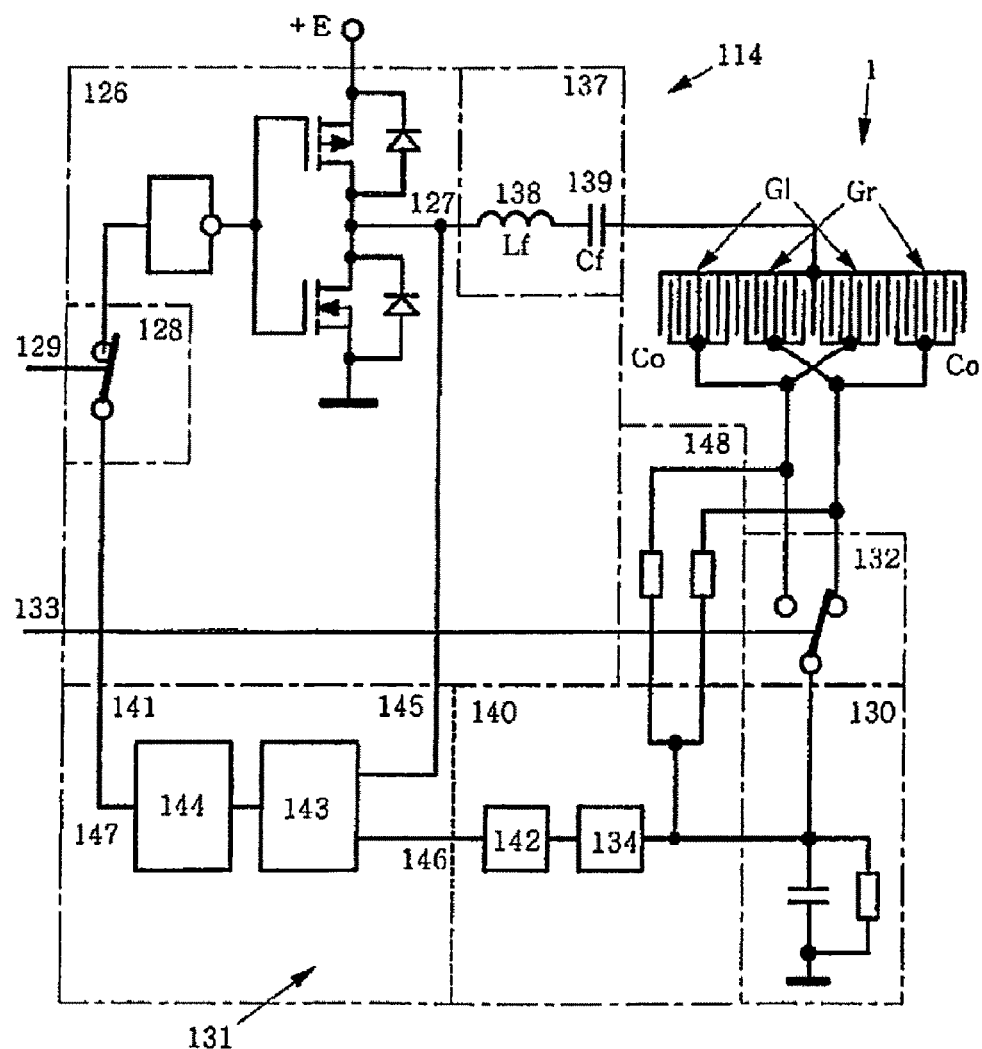

FIG. 36 shows another modification of the electric excitation device 114. In this modification the feedback circuit 131 is formed of the pulse shaper for square wave voltages 140 and the phase detector 141. The pulse shaper 140 is formed of the voltage filter 134 and the comparator 142. The phase detector 141 is formed of the converter of the phase shift to a control voltage 143 and the voltage-controlled generator 144. The phase detector 141 comprises the auxiliary input 145, the phase input 146 and the output 147.

In this modification the feedback circuit 131 is directly connected to the feedback element 130, or it may also be connected to the excitation electrodes 51 by the decoupling resistors 148—as shown in FIG. 36.

Figure 37:
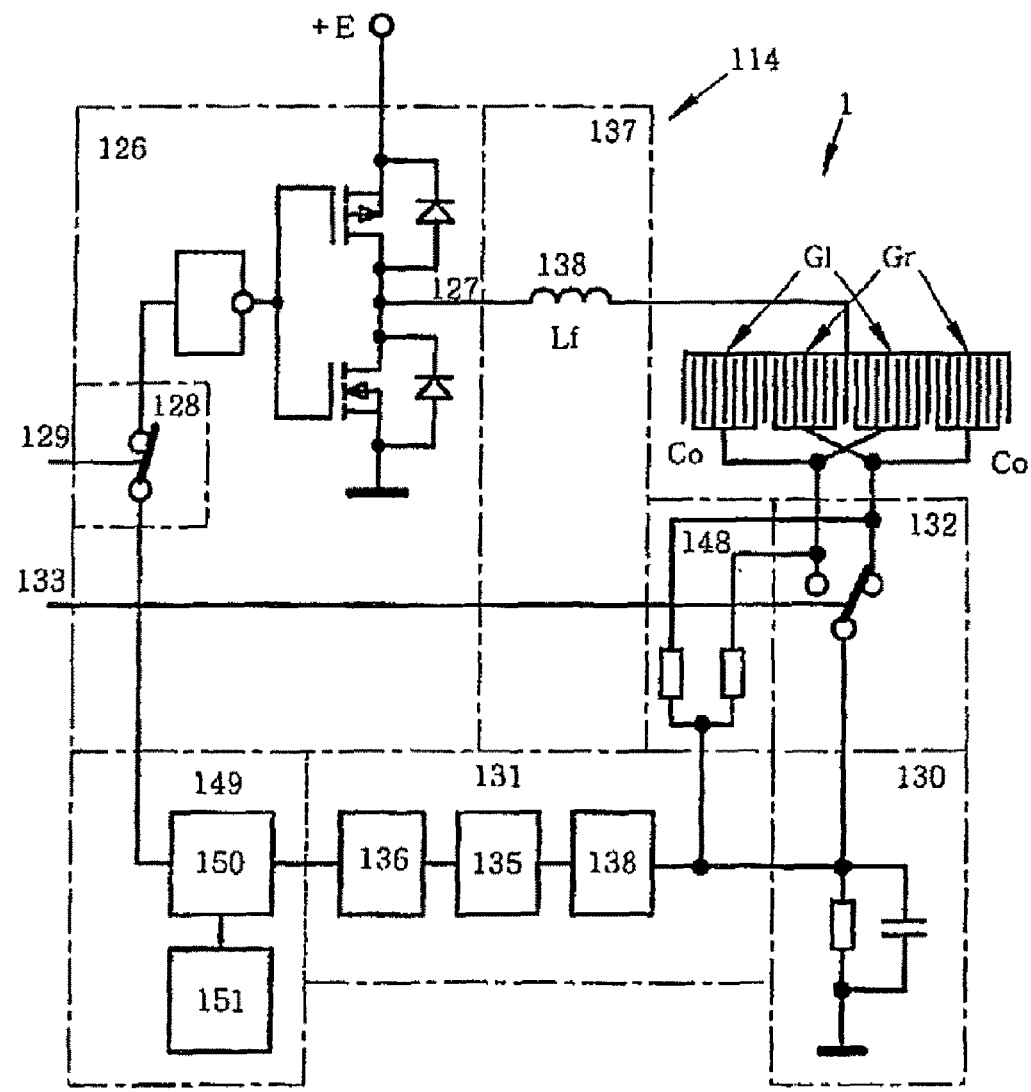

FIG. 37 shows another modification of the excitation device 114. This excitation device is formed of the PWM modulator for the feedback voltage 149. The modulator 149 is comprised of the modulation element 150 and the mesh voltage generator 151.

The modification of the electric excitation device 114 as shown in FIG. 35 is formed of the linear power amplifier 152 and the compensating coil 153 which is connected in parallel with the multilayer actuator 1. The compensating coil 153 has the inductance $L_k$. It is connected to the output 127 of the linear power amplifier 152 via the decoupling capacitor 154 having the capacitance $C_r$.

The ultrasonic motor as proposed works as follows. As soon as the sinusoidal voltage U (see FIG. 31) generated by generator GI or Gr, whose frequency is equal to $\omega_o$ (see FIG. 32), is applied to the excitation electrodes 52 and the general electrodes 51, a two-dimensional (plane) asymmetrical acoustic standing wave is generated in the multilayer actuator 1 (see FIG. 33). The frequency $\omega_o$ is here the resonance frequency at which such a wave is generated. The excitation of the wave is performed by the active zones A, C or B, D of the generator GI or the generator Gr (see FIGS. 16 . . . 21, 23). The length L of the actuator 1 defines the length of the excited asymmetrical wave.

As each active zone A, C or C, D of the generator GI or the generator Gr is formed of alternately arranged layers of the electrodes 51, 52 and the thin piezoceramic layers 53 between them (see FIGS. 20, 21, 22, 31) a maximum deformation of the actuator 1 only requires low excitation voltages. Furthermore, the actuator 1 is excited over the total volume, with the electric field being concentrated in the interior of the actuator 1 and not going outside.

In any one of the active zones A, C or B, D the excitation layers 51, the general electrodes 52 and the piezoceramic layers 53 between them may be arranged as is illustrated in positions 54, 55, 56 of FIGS. 20, 21, 22. The diverse arrangement of the layers permits the effectiveness of the excitation of the asymmetrical standing wave to be varied, by which the intensity of the excitation voltage U is modified towards the lower voltage value range.

If an asymmetrical standing wave occurs the material points 123 lying on the surface 31 (58), 59 of the multilayer plate 1 move on the linear paths of motion shown in FIG. 34.

The excited asymmetrical standing wave has characteristic features distinguishing it from the other forms of asymmetrical standing waves. It has, for instance, three maximums for the oscillation speeds: a central maximum and two lateral maximums. The central maximum is located in the center of plate 2. The lateral maximums are located at a distance of approximately ¼ of L from the end faces 59 relative to the center line of plate 2. The paths of motion 122 of the material points 123, which are located in the central maximum, are inclined towards surface 31 (58), viz. opposite to the paths of motion 122 of the material points 123 located in the lateral maximums.

The described wave has so far not been used in the known ultrasonic motors comprising a multilayer actuator.

In the motor as proposed the friction elements 3 are arranged in the areas of the central maximums or in the areas of the lateral maximums of plate 2 of the actuator 1, as is shown in FIGS. 1 . . . 12, 30. In case of an electric excitation by generator GI or generator Gr the friction elements 3 move (oscillate) on paths of motion inclined towards the friction surfaces 5, in analogy with paths of motion 122.

The movement mechanism of the driven element 7 can be explained as follows. If the friction element 3 is displaced in the direction of the friction surface 5 it gets jammed/stuck with the friction surface 5 and pushes it forward. This causes the driven element 7 to move in the direction of the inclination of path of motion 122. If the friction element 3 is displaced in the direction away from the friction surface 5 it becomes detached, and the driven element 7 is now capable of moving owing to inertia.

In the motors in which plate 2, 37 of actuator 1 is provided with a friction layer 32 (see FIGS. 13 . . . 14, 24, 25, position 67 in FIG. 25, FIG. 27) the course of motion of the driven element can be explained by the interaction of all oscillating material points of the friction layer 32 on the friction surface 5 of the driven element 7.

Motors in which the actuator 1 forms a part of the ring 23 operate analogously to the motors in which the actuator 1 is designed as a rectangular plate 2. This is due to the fact that the actuator 1 being part of the ring 23 is slightly curved. This curvature is defined by radius r, which is chosen to be approximately equal to ½ of L (see FIG. 16, position 40).

The speed of motion of the driven element 7 and the generated force depend on the angle of inclination of the path of motion of the friction element 3 relative to the friction surface 5 of the abrasion-proof layer 6 of the driven element 5. This angle is determined by the ratio L of plate 2—relative to the center line—to height H.

During the testing of prototype motors it showed that these motors develop their maximum speed and their maximum power at a ratio of L/H=4.75. The tests were carried out with actuators comprising a plate having the following dimensions L=50 mm, H=10.5 mm, D=4 mm. The plate was fabricated from a piezoelectric ceramics of the type PIC 181. The optimum L/H ratio may vary with different lengths L of the plate and different types of piezoelectric ceramics.

The operating frequency of the actuator 1 may be determined in accordance with the formula $\omega_o$=N/L, with N being the frequency constant of the excited asymmetrical wave. The frequency constant for the actuator 1 made of piezoelectric ceramics of the type PIC 181 is 8250 Hz.

In the motor as proposed the multilayer plate 2 (37, 23) of the actuator 1 comprises two asymmetrical generators for ultrasonic oscillations Gl and Gr which are arranged laterally reversed (see FIGS. 18, 19). This construction of the actuator 1 allows an independent generation of an asymmetrical standing wave in the actuator 1 by one of the generators (Gl or Gr), which is a mirror image of the wave generated by the second generator (Gr or Gl) (see FIGS. 33, 34). This characteristic of the generators makes it possible to reverse the angle of inclination of the path of motion 122 of the material points 123 located on the surface 32 (58), 24, 25 of plate 2, 23, 37 and thus vary the angle of inclination of the paths of motion of the friction elements 3 or the paths of motion of the points of the friction layers 32. The variation of the angle of inclination is accomplished by simply switching over the generators Gl and Or by means of the changeover switch 115 or 132. At the same time, the generated asymmetrical wave changes its form laterally reversed (see FIGS. 33, 34).

The reversal of the angle of inclination of the path of motion 122 permits a change of the direction of motion of the driven element 7, with the motor maintaining its motion parameters—speed and developed power.

This characteristic is fulfilled by the actuator 1 with one or two friction elements 3 on one of its lateral faces (see FIGS. 1, 2, 4, 5, 7 . . . 12), with two or four friction elements 3 on its two opposite lateral faces (see FIGS. 3, 6) and by an actuator 1 with friction layers 32 (see FIGS. 13, 14, 15, 24, 27).

The proposed invention also takes into account other plate shapes for the actuator 1, which differ from the above-described shapes and which allow an independent generation of an asymmetrical standing wave in the actuator 1 by means of one of the generators (Gl or Gr), which represents the mirror image of the wave generated by the second generator (Gr or Gl). To allow for the effective operation of the proposed ultrasonic motor it is important that the frequency of the excitation voltage U is held equal to the resonance frequency of the two-dimensional asymmetrical acoustic standing wave, which is equal to the operating frequency $\omega_o$ of the actuator 1. As the resonance frequency of the generated two-dimensional asymmetrical acoustic standing wave slightly changes in response to the ambient temperature and the load applied to the driven element 7, the electric excitation device has to follow, compensate this change.

To this end, the electric excitation device 114 is—according to the proposed invention—realized as a self-exciting generator whose excitation frequency is predetermined by the resonance frequency of the multilayer actuator 1 connected to it (see FIG. 35).

In order to realize the electric excitation device use is made of the frequency dependence of the phase shift of the current I flowing through the actuator 1 relative to the excitation voltage U. This dependence only has a zero phase shift near the mechanical resonance of the actuator 1 (see FIGS. 31, 32), i.e. near the frequency $\omega_o$.

This electric excitation device 114 works as follows. Upon applying the supply voltage E a current impulse flows through the actuator 1, which makes it start oscillating on its resonance frequencies. As a result thereof a feedback voltage is formed on the feedback element 130, which is proportional relative to the current that flows through the actuator 1 and represents the feedback signal. The voltage is supplied to the input of the feedback circuit 131 where it is filtered by filter 134. The filter filters out the first harmonic of this voltage, which corresponds to the operating frequency $\omega_o$ of the actuator 1. Next, the voltage amplitude is amplified by the amplifier 135 and the phase is shifted by the phase shifter 136. Afterwards, the voltage is supplied to the input of the power amplifier 126, is amplified by same and is supplied from its output 127 via filter 137 to the actuator 1. The circuit is compensated such that, at the operating frequency $\omega_o$, the phase-shift angle in the closed feedback circuit is equal to zero and the amplification coefficient is greater than one. Therefore, the electric excitation device 114 shown in FIG. 35 represents a self-exciting generator which oscillates at the frequency $\omega_o$. The compensation of the circuit is accomplished by the phase shifter 136 and the amplifier 135 of the feedback circuit 131. Upon applying the supply voltage E or closing the on-off switch 128 the device oscillates independently at the frequency $\omega_o$.

Also, another principle may be applied so as to hold the operating frequency of the excitation device 114 equal to the frequency $\omega_o$. Here, the feedback circuit 131 is formed of the pulse shaper for square wave voltage 140 and the phase detector 141. The pulse shaper 140 is formed of the filter 134 and the comparator 142. As shown in FIG. 36, the phase detector 141 comprises the converter of the phase shift to a control voltage 143 and the voltage-controlled generator 144.

This electric excitation device works as follows. Upon applying the supply voltage E the generator 144 starts oscillating on a frequency near the frequency $\omega_o$. At the beginning the actuator 1 oscillates on this frequency. On the feedback element 130 or on the excitation electrode (free electrode) 51 the feedback voltage is formed. This voltage is supplied via the filter 134 to the comparator 142. The comparator 142 generates a square wave voltage which is supplied to the phase input (measurement input) 146 of the phase detector 141. The auxiliary square wave voltage is available at the auxiliary input 145 of the detector 141.

Accordingly, the two square wave voltages of the phase shift are available at the inputs 145 and 146, by means of which the intensity of the control voltage available at the output of the converter 143 is determined. This voltage is supplied to the input of the generator 144 where it controls by means of the frequency the excitation of the generator, namely in such a way that it shifts the same to such an extent that it is permanently equal to the frequency $\omega_o$.

In this modification the phase detector 141 can be realized both by individual electronic components and a program-controlled microprocessor. Also, the phase detector 141 may be realized by components having a hard-wired logic.

In the first and second cases the output filter 137 represents a bandpass filter tuned to the frequency $\omega_o$. It serves to filter out the first harmonic from the square wave voltage provided by the power amplifier 126, whose frequency is equal to $\omega_o$. The capacitance of the capacitor 130 of this filter is chosen such that the condition that it has to be equal to or slightly greater than the input capacitance $C_0$ of the multilayer actuator 1 is fulfilled. Thus, it is possible to obtain the necessary quality of the filter.

FIG. 37 shows another modification of the electric excitation device 114. The electric excitation device is here formed of the symmetrical PWM modulator 149 for the feedback voltage. The modulator 149 is formed of the modulation element 150 and the mesh voltage generator 151 whose frequency is approximately 10 times greater than the frequency $\omega_o$. An operation amplifier or a comparator may be used as modulation element 150.

With the aid of modulator 149 the sinusoidal feedback voltage is modulated by the high-frequency mesh voltage. As a result, a symmetrical PWM-modulated square wave voltage is available at the output of the modulator 149, whose pulse repetition frequency is approximately 10 times greater than the frequency $\omega_o$. This voltage is supplied to the input of the power amplifier 126 where it is amplified by the latter.

As a result, the square wave PWM voltage, whose pulse repetition frequency is approximately 10 times greater than the frequency $\omega_o$, is supplied to the input of filter 137. The voltage spectrum contains components whose frequency is equal to $\omega_o$. For selecting this component the inductance $L_f$ of coil 138 of filter 137 may be chosen to be significantly smaller (approximately 5 . . . 10 times smaller) as compared to the preceding modifications. The input capacitance $C_0$ of the actuator 1 (see FIG. 37) may be used as capacitor 139 for the filter 137. In this case the filter 137 is tuned to a frequency between $\omega_o$ and $10\omega_o$. Thus, it is possible to significantly reduce the active resistance of the induction coil 138, i.e. the energy losses in the input filter 137 are significantly reduced. This increases the efficiency of the electric excitation device 114.

Figure 38:
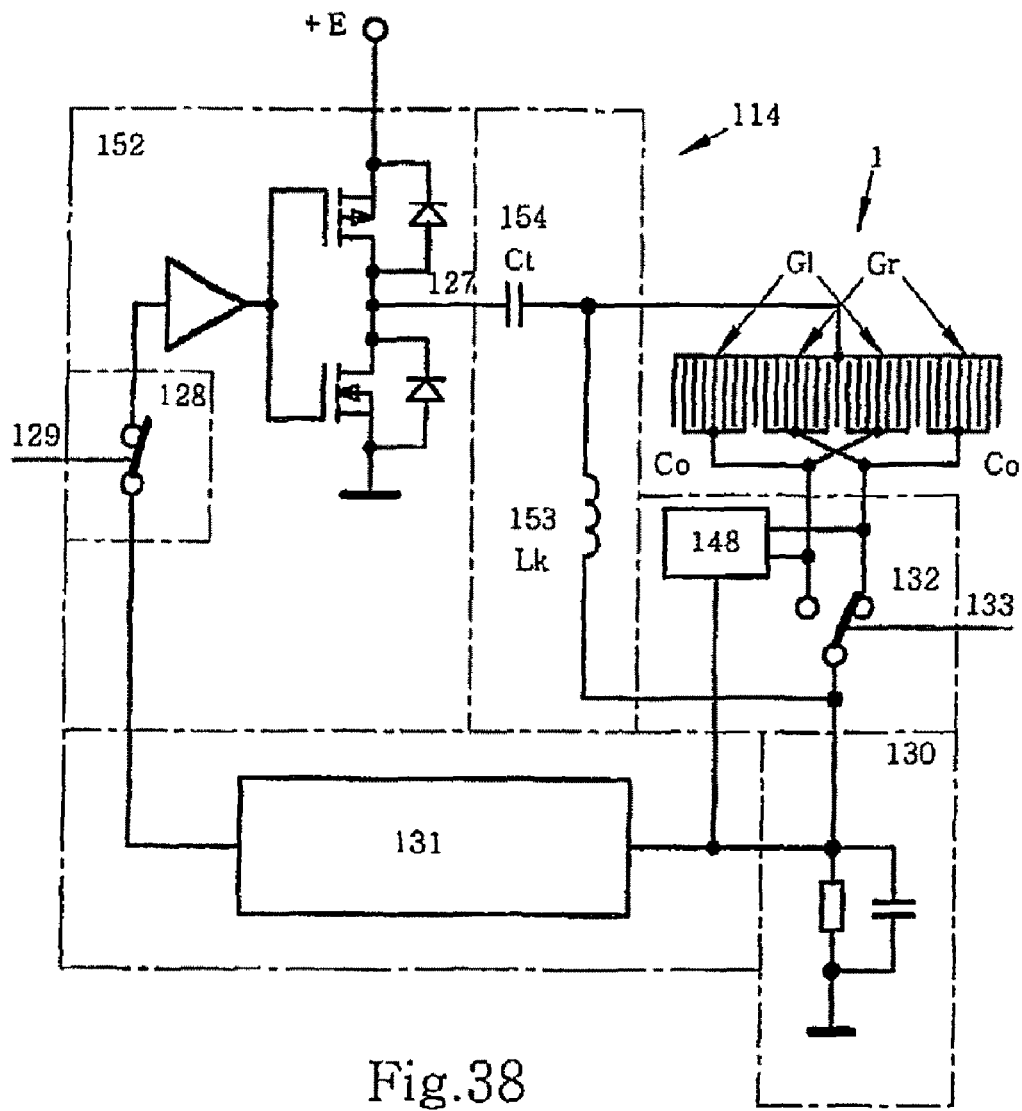

If a linear power amplifier 152 is used, a compensating coil 153 may be connected in parallel with the multilayer actuator 1, as is shown in FIG. 38. The inductance is chosen by taking into account the condition $\omega_o L_k = 1/\omega_o C_o$, with $C_t$ being chosen to be significantly greater $C_o$.

Hence, it is possible to compensate the electric capacitance $C_o$ and substantially increase the operating stability of the linear power amplifier 152 and, thus, that of the motor as a whole.

In the ultrasonic motor realized in accordance with the invention the ratio of length L of the multilayer actuator to height H is approximately 2 times greater as compared to the actuator according to DE 10 2005 039 358 A1. Therefore, the mechanical performance of the inventive motor comprising a friction element on the actuator is two times greater, with the same height H. On the other hand, the height of the multilayer actuator can be kept two times smaller as compared to DE 10 2005 039 358 A1, with the same mechanical performance.

This expands the functional fields of application of the ultrasonic motor according to the invention.

In the motor as proposed two friction elements may be arranged on one side of the multilayer actuator. This substantially enhances the mechanical stability of the multilayer actuator. Even under optional mechanical loads applied to the driven element 7 such an actuator does not change its angular position. This significantly increases the stability of the tensile force of the motor and increases the constancy of the moving speed of the driven element 7. Both allow an enhancement of the positioning accuracy of the driven element 7 within the range of the maximum tensile force of the motor.

The multilayer actuator of the proposed inventive motor has an optimum angle of inclination of the paths of motion in a ratio of length L to height H which is two times greater (more favorable) than that of the multilayer actuator according to DE 10 2005 039 358 A1. The length L to height H ratio in the multilayer actuator according to DE 10 2005 039 358 A1 is not optimal. Therefore, with like geometrical dimensions of the multilayer actuator, the proposed motor according to the invention is characterized by a significantly smaller abrasion of the frictional contact and, consequently, by a longer lifetime as compared to the motor according to DE 10 2005 039 358 A1. It has a lower noise level.

As in the actuator of the proposed motor a two-dimensional acoustic standing wave and no bending wave is generated, the motor realized according to the invention can be equipped with a mechanically more rigid driven element.

Therefore, such a motor has a greater mechanical performance than the motors according to U.S. Pat. No. 6,081,063; U.S. Pat. No. 7,205,703 B2; U.S. Pat. No. 7,211,929 B2; US 2007/0108869 A1.

As the multilayer actuator of the proposed ultrasonic motor only has a point of resonance near the operating frequency it is possible to uniquely control the frequency of the electric excitation device in such a way that it can be kept equal to the operating frequency of the actuator. This enhances the operating stability of the inventively realized ultrasonic motor in a broad temperature range and with great load forces being present. As compared to the known motors according to U.S. Pat. No. 6,081,063; U.S. Pat. No. 7,205,703 B2; U.S. Pat. No. 7,211,929 B2; US 2007/0108869 A1 the motor realized according to the proposal works more stably as temperatures change and in the presence of great tensile forces.

LIST OF REFERENCE NUMBERS 1 multilayer actuator
2 rectangular multilayer plate of the actuator 1
3 friction element of the actuator 1
4 lateral face of the actuator 1
5 friction surface of the abrasion-proof layer 6
6 abrasion-proof layer of the driven element 7
7 driven element
8 rod of the driven element 7
9 bearing
10 base plate
11 pressing device
12 leaf spring of the pressing device 11
13 insulating sleeve
14 holding member
15 driven element 7 designed as disc
16 axle
17 abutment
18 U-shaped spring of the pressing device 11
19 guide rod
20 guide groove
21 guide rail
22 driven element 7 designed as part of a ring
23 multilayer actuator 1 as multilayer plate in the form of a part of a ring
24 inner cylindrical surface of the actuator 1 as part of ring 23

25 outer cylindrical surface of the driven element 7 as part of the ring 23
26 elastic (resilient) element
27 outer cylindrical surface of the actuator 1 as part of ring 23
28 inner cylindrical surface of the driven element 7 as part of the ring 23
29 driven element 7, designed as ring
30 inner surface of the driven element 7 designed as ring 29
31 plane surfaces of the lateral faces 4 of the plate 2
32 friction layer
33 slide of driven element 7
34 friction plates of driven element 7
35 two-dimensional (flat) formed spring of the pressing device 11
36 pins of slides 33
37 multilayer plate of the actuator 1 with guide channels 20 or guide rails 21
38 three-dimensional (volumetric) formed spring of the pressing device 11
39 ... 50 illustrations with drawings of the multilayer plate 2, 37, 23 of the actuator 1
51 layer of the excitation electrodes or the excitation electrode
52 layer of the general electrode or the general electrode
53 piezoceramic layers
54 ... 56 illustrations with drawings of the multilayer plate 2, 34 of the actuator 1
57 principal surfaces of the plate 2, 37, 23 of the actuator
58 surfaces of the lateral faces 4 of plate 2, 37, 23 of the actuator 1
59 end faces of plate 2, 37
60, 61 illustrations indicating the directions of polarization of the piezoceramic layers 53
62 connecting electrode
63 projection of electrodes 48, 49
54 contact surface
65, 66, 67 illustrations of modifications of current-carrying conductors
68 cable, employed as current-carrying conductor
69 leaf spring, employed as current-carrying conductor
70 spacer of current-carrying rubber
71 elastic lamella employed as current-carrying conductor
72 ... 86 illustrations of modifications of the friction elements 3
87 lower layer of friction element 86
88 upper layer of friction element 86
89 ... 95 illustrations of modifications of the actuator 1
96 ... 105 illustrations of modifications of the driven elements 7
106 holding plate
107 sound-insulating layer
108 thin elastic plates
109 ... 112 illustrations with modifications of the driven elements 7
113 holding members
114 device for electric excitation of the generators for ultrasonic oscillations
115 changeover switch for the generators for ultrasonic oscillations
116, 117 illustrations showing the frequency dependences of inductance and phase shift
118, 119, 120, 121 illustrations showing the deformation of the plate 2
122 paths of motion of the material points 123
123 material points on surfaces 31 (58), 59 of plate 2
124, 125 illustrations showing the paths of motion 122
126 pulse power amplifier
127 output of power amplifier 126
128 on-off switch
129 control input of on-off switch 128
130 feedback element
131 feedback circuit
132 controllable changeover switch for the ultrasonic generators
133 control input of the changeover switch 132
134 voltage filter of the feedback circuit
135 voltage amplifier of the feedback circuit
136 phase shifter of the feedback circuit
137 output filter
138 inductance coil of filter 137
139 capacitor of filter 137
140 pulse shaper for square wave voltage
141 phase detector
142 comparator
143 converter of the phase shift to a control voltage
144 voltage-controlled generator
145 auxiliary input of phase detector 141
146 phase input of detector 141
147 output of phase detector 141
148 decoupling resistors
149 symmetrical PWM modulator
150 modulation element
151 mesh voltage generator
152 linear power amplifier
153 compensation coil
154 decoupling capacitor

The invention claimed is:

1. Ultrasonic motor comprising a multilayer actuator as multilayer plate, having one or more friction elements or friction layers on its lateral faces which are pressed on or against which one or two friction layers of the driven element are pressed, and an electric excitation device of the actuator, characterized in that
the multilayer plate comprises two intersecting, mirror-imaged, asymmetrical generators for ultrasonic oscillations, realized in the form of layers of excitation electrodes and general electrodes which are arranged alternately with layers of piezoelectric ceramics, wherein a two-dimensional asymmetrical acoustic standing wave is generated in the multilayer actuator.

2. Ultrasonic motor comprising a multilayer actuator according to claim 1,
characterized in that
the multilayer plate is realized as a rectangle or as part of a ring or in any other optional form, wherein the asymmetrical standing wave excited by one of the aforementioned generators represents a mirror image of the wave generated by the second generator.

3. Ultrasonic motor comprising a multilayer actuator according to claim 1,
characterized in that
the height of the multilayer plate is equal to or slightly smaller than a quarter of its length.

4. Ultrasonic motor comprising a multilayer actuator according to claim 2,
characterized in that
the alternately arranged layers of electrodes and layers of piezoelectric ceramics of the multilayer actuator in form of a rectangular plate are arranged parallel to its principal surfaces or parallel to its lateral faces or parallel to its end faces.

5. Ultrasonic motor comprising a multilayer actuator according to claim 2,
characterized in that the alternately arranged layers of the electrodes and layers of the piezoelectric ceramics of the multilayer actuator in form of a part of the ring are arranged parallel to the principal surfaces of the multilayer plate.

6. Ultrasonic motor comprising a multilayer actuator according to claim 1,
characterized in that
the layers of the electrodes and the layers of the piezoelectric ceramics of the multilayer plate are connected to each other during the production of the piezoelectric ceramics and form a monolithic body.

7. Ultrasonic motor comprising a multilayer actuator according to claim 1,
characterized in that
the surface of the multilayer plate is covered with a thin protective layer of glass.

8. Ultrasonic motor comprising a multilayer actuator according to claim 1,
characterized in that
the multilayer plate comprises one or two friction elements which are disposed on one or two of its lateral faces in the central part.

9. Ultrasonic motor comprising a multilayer actuator according to claim 1,
characterized in that
the multilayer plate comprises two or four friction elements which are disposed on one or two of its lateral faces at a distance from the end faces of a quarter of its length relative to the center line.

10. Ultrasonic motor comprising a multilayer actuator according to claim 8,
characterized in that
the friction elements are made of a hard, abrasion-proof material, oxide ceramics or another similar material.

11. Ultrasonic motor comprising a multilayer actuator according to claim 10,
characterized in that
the friction elements are welded onto the surface of the multilayer plate by means of a low-melting glass.

12. Ultrasonic motor comprising a multilayer actuator according to claim 8,
characterized in that
the friction elements are realized as stripes of abrasion-proof glass or glass enriched with particles of an abrasion-proof material.

13. Ultrasonic motor comprising a multilayer actuator according to claim 2,
characterized in that
the friction elements or the lateral faces of the multilayer plate comprise guide grooves having a round, V-shaped or any other form.

14. Ultrasonic motor comprising a multilayer actuator according to claim 2,
characterized in that
the friction elements or the lateral faces of the multilayer plate comprise guide rails having a round, V-shaped or any other form.

15. Ultrasonic motor comprising a multilayer actuator according to claim 13,
characterized in that
the guide grooves or guide rails comprise abrasion-proof layers.

16. Ultrasonic motor comprising a multilayer actuator according to claim 1,
characterized in that
the multilayer plate of the oscillator comprises two or four holding members which are arranged on one of its lateral faces.

17. Ultrasonic motor comprising a multilayer actuator according to claim 1,
characterized in that
the electric excitation device is realized as a self-exciting generator whose excitation frequency is determined by the resonance frequency of the oscillator connected to it.

18. Ultrasonic motor comprising a multilayer actuator according to claim 1,
characterized in that
the electric excitation device is comprised of a voltage-controlled generator whose excitation frequency is predetermined by the phase detector whose phase input is electrically connected to the feedback element or to the electrode of the multilayer actuator.

19. Ultrasonic motor comprising a multilayer actuator according to claim 17,
characterized in that
the excitation device is comprised of a half-bridge or a bridge power amplifier which is connected to the multilayer actuator by means of the $L_f C_f$ series filter, with the electric capacitance of the capacitor being approximately equal to or slightly greater than the input capacitance of the multilayer actuator.

20. Ultrasonic motor comprising a multilayer actuator according to claim 17,
characterized in that
the electric excitation device is realized as self-exciting generator whose excitation frequency is determined by the resonance frequency of the oscillator connected to it and includes a symmetrical PWM modulator for the feedback voltage and a generator for a modulated mesh voltage whose frequency is approximately 10 times greater than the operating frequency of the multilayer actuator.

21. Ultrasonic motor comprising a multilayer actuator according to claim 20,
characterized in that
the electric excitation device is connected via the $L_f C_f$ bandpass filter to the multilayer actuator whose capacitor is formed by the electric capacitance of the multilayer actuator, and the resonance frequency is between the operating frequency of the actuator and the modulation frequency of the PWM modulator.

22. Ultrasonic motor comprising a multilayer actuator according to claim 1,
characterized in that
the electric excitation device consists of a linear power amplifier and includes a compensating coil connected in parallel with the multilayer actuator.

23. Ultrasonic motor comprising a multilayer actuator according to claim 1,
characterized in that
the piezoelectric ceramics are polarized.

24. Ultrasonic motor comprising a multilayer actuator according to claim 23,
characterized in that
the polarization vector of the polarized piezoelectric ceramics extends substantially perpendicular to the surface of the excitation electrodes and the general electrodes.

25. Ultrasonic motor comprising a multilayer actuator according to claim 23,
characterized in that the polarization vector of the polarized piezoelectric ceramics is directed towards the general electrodes or directed away from the general electrodes.

26. Ultrasonic motor comprising a multilayer actuator according to claim 23, characterized in that
the course of the polarization vectors is different in different generators.

* * * * *

UNITED STATES PATENT AND TRADEMARK OFFICE
CERTIFICATE OF CORRECTION

PATENT NO. : 8,344,592 B2  
APPLICATION NO. : 12/736022  
DATED : January 1, 2013  
INVENTOR(S) : Wladimir Wischnewskiy and Alexej Wischnewskij Page 1 of 1

It is certified that error appears in the above-identified patent and that said Letters Patent is hereby corrected as shown below:

On the Title Page:

In Item (12), amend "Wischnewskly et al." to

-- Wischnewskiy et al. --

Delete Item (75) Inventors and insert the following paragraph:

-- Wladimir Wischnewskiy, Waldbronn (DE); Alexej Wischnewskij, Wörth, (DE) --

Delete Item (73) Assignee and insert the following paragraph:

-- Physik Instrumente (PI) GmbH & Co. KG, Karlsruhe (DE) --

Signed and Sealed this  
Seventeenth Day of September, 2013

Teresa Stanek Rea  
*Deputy Director of the United States Patent and Trademark Office*